United States Patent
Yu et al.

(10) Patent No.: US 8,464,120 B2
(45) Date of Patent: Jun. 11, 2013

(54) METHOD AND SYSTEM FOR DATA TRANSMISSION IN A MULTIPLE INPUT MULTIPLE OUTPUT (MIMO) SYSTEM INCLUDING UNBALANCED LIFTING OF A PARITY CHECK MATRIX PRIOR TO ENCODING INPUT DATA STREAMS

(75) Inventors: Qian Yu, Singapore (SG); Ping Luo, Singapore (SG); Masayuki Hoshino, Kanagawa (JP)

(73) Assignee: Panasonic Corporation, Osaka (JP)

( * ) Notice: Subject to any disclaimer, the term of this patent is extended or adjusted under 35 U.S.C. 154(b) by 985 days.

(21) Appl. No.: 12/445,275

(22) PCT Filed: Oct. 10, 2006

(86) PCT No.: PCT/SG2006/000306
§ 371 (c)(1),
(2), (4) Date: Apr. 10, 2009

(87) PCT Pub. No.: WO2008/045001
PCT Pub. Date: Apr. 17, 2008

(65) Prior Publication Data
US 2010/0077275 A1    Mar. 25, 2010

(51) Int. Cl.
*G06F 11/00* (2006.01)
(52) U.S. Cl.
USPC .......................................................... 714/752
(58) Field of Classification Search
USPC ........................................................ 714/752
See application file for complete search history.

(56) References Cited

U.S. PATENT DOCUMENTS

| 5,105,442 | A | 4/1992 | Wei |
| 5,214,656 | A | 5/1993 | Chung et al. |
| 7,774,675 | B1 * | 8/2010 | Matache et al. ............... 714/755 |
| 2003/0037298 | A1 * | 2/2003 | Eleftheriou et al. ........... 714/752 |
| 2004/0077306 | A1 | 4/2004 | Shor et al. |
| 2005/0078765 | A1 | 4/2005 | Jeong et al. |
| 2005/0166131 | A1 | 7/2005 | Xia et al. |
| 2005/0204273 | A1 * | 9/2005 | Jeong et al. .................... 714/801 |
| 2005/0268202 | A1 | 12/2005 | Molisch et al. |
| 2006/0156169 | A1 | 7/2006 | Shen et al. |
| 2007/0162827 | A1 * | 7/2007 | Walton et al. .................. 714/774 |
| 2007/0220395 | A1 * | 9/2007 | Nimbalker et al. ............ 714/758 |
| 2010/0192038 | A1 * | 7/2010 | Eroz et al. ...................... 714/752 |

OTHER PUBLICATIONS

Kuo, Chih-Hung, et al., "Robust Video Transmission over Wideband Wireless Channel Using Space-Time Coded OFDM Systems," *IEEE*, pp. 931-936 (2002).
Sabir, M. Farooq, et al., "An Unequal Error Protection Scheme for Multiple Input Multiple Output Systems," *IEEE*, pp. 575-579 (2002).

(Continued)

*Primary Examiner* — Scott Baderman
*Assistant Examiner* — Jigar Patel
(74) *Attorney, Agent, or Firm* — Douglas J. Christensen

(57) ABSTRACT

A method for data transmission in a multiple input multiple output (MIMO) system, the method including, receiving multiple input data streams; performing low density parity check (LDPC) encoding of the input data streams utilizing a parity check matrix, the parity check matrix including a plurality of sub-parity check matrices for encoding respective ones of the input data streams; and performing space time encoding for transmitting the LDPC encoded input data streams over a plurality of antennas.

26 Claims, 17 Drawing Sheets

OTHER PUBLICATIONS

Kuo, Chih-Hung, et al., "Embedded Space-Time Coding for Wireless Broadcast With Heterogeneous Receivers," *IEEE*, pp. 1749-1753 (2002).

Myung, Seho, et al., "Lifting Methods for Quasi-Cyclic LDPC Codes," *IEEE Communications Letters*, vol. 10, No. 6, pp. 489-491 (Jun. 2006).

* cited by examiner $$718\left\{\begin{matrix}
\begin{bmatrix}
1 & 0 & 1 & 0 & 0 & 0 & 0 & 1 & 0 & 0 & 0 & 0 & 0 & 0 & 0 & 0 \\
0 & 1 & 0 & 1 & 1 & 0 & 0 & 0 & 0 & 0 & 0 & 0 & 0 & 0 & 0 & 0 \\
0 & 0 & 0 & 0 & 1 & 1 & 0 & 1 & 0 & 0 & 0 & 0 & 0 & 0 & 0 & 0 \\
0 & 0 & 1 & 0 & 0 & 0 & 1 & 0 & 0 & 0 & 0 & 0 & 0 & 0 & 0 & 0 \\
0 & 1 & 0 & 1 & 0 & 1 & 0 & 0 & 0 & 0 & 0 & 0 & 0 & 0 & 0 & 0 \\
1 & 0 & 0 & 0 & 0 & 0 & 1 & 0 & 0 & 0 & 0 & 0 & 0 & 0 & 0 & 0 \\
0 & 0 & 0 & 1 & 0 & 1 & 0 & 0 & 1 & 0 & 1 & 0 & 1 & 1 & 1 & 1 \\
0 & 1 & 0 & 0 & 1 & 0 & 0 & 0 & 1 & 1 & 1 & 1 & 1 & 0 & 0 & 1 \\
1 & 0 & 0 & 0 & 0 & 0 & 0 & 1 & 1 & 1 & 0 & 1 & 0 & 1 & 1 & 1 \\
0 & 0 & 1 & 0 & 0 & 0 & 1 & 0 & 0 & 1 & 1 & 1 & 1 & 1 & 1 & 0
\end{bmatrix}
\end{matrix}\right.$$

| I branch | $u'_1(1)$ | $u'_2(1)$ | $u'_3(1)$ | $u'_4(1)$ | $u'_1(2)$ | $u'_2(2)$ | $u'_3(2)$ | $u'_4(2)$ |
|---|---|---|---|---|---|---|---|---|
| Q branch | $v'_1(1)$ | $v'_2(1)$ | $v'_3(1)$ | $v'_4(1)$ | $v'_1(2)$ | $v'_2(2)$ | $v'_3(2)$ | $v'_4(2)$ |

Antenna 1       1110

| I branch | $u'_5(1)$ | $u'_6(1)$ | $u'_7(1)$ | $u'_8(1)$ | $u'_5(2)$ | $u'_6(2)$ | $u'_7(2)$ | $u'_8(2)$ |
|---|---|---|---|---|---|---|---|---|
| Q branch | $v'_5(1)$ | $v'_6(1)$ | $v'_7(1)$ | $v'_8(2)$ | $v'_5(2)$ | $v'_6(2)$ | $v'_7(2)$ | $v'_8(2)$ |

Antenna 2       1112

| I branch | $u'_9(1)$ | $u'_{10}(1)$ | $u'_{11}(1)$ | $u'_{12}(1)$ | $u'_9(2)$ | $u'_{10}(2)$ | $u'_{11}(2)$ | $u'_{12}(2)$ |
|---|---|---|---|---|---|---|---|---|
| Q branch | $v'_9(1)$ | $v'_{10}(1)$ | $v'_{11}(1)$ | $v'_{12}(1)$ | $v'_9(2)$ | $v'_{10}(2)$ | $v'_{11}(2)$ | $v'_{12}(2)$ |

Antenna 3       1114

| I branch | $u'_{13}(1)$ | $u'_{14}(1)$ | $u'_{15}(1)$ | $u'_{16}(1)$ | $u'_{13}(2)$ | $u'_{14}(2)$ | $u'_{15}(2)$ | $u'_{16}(2)$ |
|---|---|---|---|---|---|---|---|---|
| Q branch | $v'_{13}(1)$ | $v'_{14}(1)$ | $v'_{15}(1)$ | $v'_{16}(1)$ | $v'_{13}(2)$ | $v'_{14}(2)$ | $v'_{15}(2)$ | $v'_{16}(2)$ |

Antenna 4       1116

Figure 11(b)

METHOD AND SYSTEM FOR DATA TRANSMISSION IN A MULTIPLE INPUT MULTIPLE OUTPUT (MIMO) SYSTEM INCLUDING UNBALANCED LIFTING OF A PARITY CHECK MATRIX PRIOR TO ENCODING INPUT DATA STREAMS

PRIORITY CLAIM

The present application is a National Phase entry of PCT Application No. PCT/SG2006/000306, filed Oct. 18, 2006, the disclosure of which is hereby incorporated by reference herein in its entirety.

FIELD OF INVENTION

The invention relates broadly to a method for data transmission in a multiple input multiple output (MIMO) system, a transmitter in a MIMO system, a computer readable data storage medium having stored thereon computer code means for instructing a MIMO system to execute a method for data transmission in the MIMO system, a method for processing received data in a MIMO system, a receiver in a MIMO system and a computer readable data storage medium having stored thereon computer code means for instructing a MIMO system to execute a method for processing received data in the MIMO system.

BACKGROUND

Wireless communication systems have been used to carry voice traffic and low data rate non-voice traffic. Current wireless communication systems can also carry high data rate multimedia traffic, such as video, data, and other types of traffic. Multimedia Broadcast and Multicast Service (MBMS) channels may be used to transmit streaming applications, such as radio broadcast, television broadcast, movies, and other types of audio or video contents.

The multimedia broadcast multicast service is defined in the Third Generation Partnership Project (3GPP) Release 6 documentation. The standard TS22.146 defines the high level service requirements of the MBMS, and the standard TS22.246 defines typical service scenarios. MBMS services allow user equipment (UE) such as mobile telephones or other mobile terminals to receive services from service providers via a network. The services are generally delivered in a packet format, currently in the form of IP Internet protocol (IP) packets. The services are typically provided by the service providers to a radio network controller that controls how the services are delivered to mobile terminals within the network. The radio network controller typically schedules the transmission of services according to network resources and other factors. Thus, MBMS is a packet service (PS) domain service for transferring multimedia data such as audio, pictures, video, etc, to a plurality of terminals using a unidirectional point-to-multipoint bearer service.

As MBMS is a multimedia service, multiple services of different Quality of Service (QoS) or multiple streams of different QoS in a same service may be provided to a single UE or to different UEs. In addition, MBMS transmission mechanisms are typically needed to support variable source data-rates. In other words, source data may vary in transmission rates and bit error rates (BERs).

As the MBMS channel is unidirectional, a transmitting base station cannot acknowledge any reception error at a UE. Therefore, means of information protection is desirable.

For consideration of information protection, transmission of a modulated information signal over a wireless communication channel requires selection of appropriate methods for protecting the information in the modulated signal. Such methods may comprise, for example, encoding, symbol repetition, interleaving, and other known methods.

For broadcast/multicast services, the characteristics and requirements of the broadcast/multicast services are specified by 3GPP MBMS and the related broadcast/multicast service layer functions. Simultaneous distribution of different content data may be required in a MBMS service and simultaneous reception of more than one MBMS service for one terminal may be required. MBMS transport services may vary, for instance, in QoS parameters. In such cases, unequal error protection mechanisms (UEP) are typically required to support various different QoS for the high data rate communication for MBMS services in wireless systems. In the following description, data with higher quality requirement and/or lower rate requirement are defined as the higher priority data and data with lower quality requirement and/or higher rate requirement are defined as the lower priority data.

Two types of methods have been applied for UEP. One type comprises applying a more powerful conventional error-correcting code to the higher priority data. The other type comprises using non-uniformly spaced modulation constellation or hierarchical modulation to provide unequal protection for the data with different priorities. One method, known as coded modulation, as described in U.S. Pat. No. 5,105,442 may achieve both power-efficiency and bandwidth-efficiency by combining the above two methods.

Another method described in U.S. Pat. No. 5,214,656 combines the coded modulation with a time division multiplexing scheme. Signals with different priorities are separately coded and modulated. The modulated signals with different priorities are then mapped to different time-slots.

The above mentioned methods may provide good performance of unbalanced data transmission but have limited capacity due to their single transmit antenna configuration.

In current technologies, Multiple Input Multiple Output (MIMO) communication systems employ multiple antennas at a transmitter and/or a receiver to improve coverage, quality and capacity. Therefore, one possible way to increase the system capacity of a MBMS system is to use multiple antennas to perform space-time (ST) processing. The concept of combining space-time processing with conventional UEP techniques may be employed to achieve more capacity and better quality.

One method of UEP, described in C. H. Kuo, et al., 'Robust video transmission over wideband wireless channel using space-time coded OFDM system', *WCNC* 2002, vol. 3. March 2002, comprises concatenating forward error correction (FEC) with ST code in MIMO systems. In this method, more robustness is provided to the data with higher priority by adopting more powerful FEC but the embedded ST code does not provide differentiation between data with different priorities. Therefore, one problem that may arise is that this kind of concatenation with the unified space-time processing cannot provide further differentiation between data with different priorities and thus, limited protection levels can be supported.

Yet other methods based on combining different space-time technologies have been proposed for UEP in MIMO systems. See for example, Muhammad Farooq Sabir, Robert W. Heath Jr, and Alan C. Bovik "An unequal error protection scheme for multiple input multiple output systems", *IEEE Asilomar Conference on Signals, Systems and Computers*, vol 1, pp. 575-579, November 2002; and, C. H. Kuo, et al., "Embedded space-time coding for wireless broadcast with heterogeneous receivers", *Globecom* 2000, vol 21, November, 2000. However, as these proposed systems require a change of the coding structure of the space time coder for every different protection requirements and also only provide specific rates and specific protection levels when the space-time coders are selected, these systems are low in flexibility and are highly complex.

For concatenation codes used in channel coding and space-time coding, turbo codes using an iterative decoding technique are provided as a high-reliable channel coding technique for third generation wireless communication in the International Mobile Telecommunications-2000 (IMT-2000) standard. The turbo codes may perform the coding operation by using parallel concatenated recursive systematic convolutional (RSC) codes and perform the decoding operation using the iterative decoding technique. In addition, the turbo codes represent superior performance approaching the so-called Shannon's limitation in respect of a BER if an interleaver size is made larger and the iterative decoding is sufficiently performed. However, if the turbo codes are employed, one problem that may arise is that the number of operations may increase resulting in high complexity. Another problem that may arise is that as both the size of the interleaver and the number of iterative decoding operations increase, a time delay may occur making a real time process difficult.

Beyond 3G, wireless communication systems are being developed in order to transmit even higher data rate and provide more services. In such systems, a channel coding technique called low density parity check (LDPC) code is becoming more popular due to its superior characteristics as compared to conventional turbo codes, in respect of complexity and performance.

An LDPC code is defined by a parity check matrix H in which the number of element "1" in the matrix is sparsely distributed and the rest of the elements are all zeros. At a decoder, by checking whether the decoded signal is a null space of the parity check matrix H, decoding errors can be indicated. For the convenience of description, row weight (or row degree) is defined by the number of 1's in a row of the parity check matrix H, and column weight (or column degree) is defined by the number of 1's in a column. Unless otherwise specified, degree refers to column degree in the following description.

The LDPC code may be described by both a matrix and a factor graph. The LDPC code may be decoded in a factor graph using an iterative decoding algorithm based on a sum-product algorithm. The decoder, employing the LDPC code, is less complex than a decoder using turbo code. Furthermore, a parallel processing decoder can be easily embodied. Therefore, a space-time encoder/decoder may have superior channel coding/decoding performance if the space-time encoder/decoder performs coding/decoding operations using the LDPC code.

However, current space-time LDPC code implementations cannot solve the problem of transmitting multi-stream data simultaneously in a MIMO system where the QoS and/or frame length of each stream and the number of transmission antennas are scalable. A space-time LDPC coding method is described in US 2005/0078765 for adaptation to a number of transmission antennas by forming a lifting LDPC matrix. However, the above method cannot realize the flexible adaptation to each transmission stream of multi-stream data since the same lifting matrices (i.e., in terms of dimension and density) are used for each of the multi-streams and the expanding factor is fixed to be equal to the number of transmission antennas. The term "lifting" here refers to a method for expanding the size of a parity-check matrix through sub-matrix replacement. In other words, each element in the parity-check matrix may be replaced by a sub-matrix.

In view of the above, transmission techniques that may simultaneously support various error protection requirements in high rate data transmission, e.g. MBMS services, at high system flexibility and low implementation complexity are desired.

Hence, there exists a need for a method and system for data transmission in a multiple input multiple output (MIMO) system to address at least one of the above problems.

SUMMARY

In accordance with a first aspect of the present invention, there is provided a method for data transmission in a multiple input multiple output (MIMO) system, the method comprising, receiving multiple input data streams; performing low density parity check (LDPC) encoding of the input data streams utilising a parity check matrix, wherein the parity check matrix comprises a plurality of sub-parity check matrices for encoding respective ones of the input data streams; and performing space time encoding for transmitting the LDPC encoded input data streams over a plurality of antennas.

The step of performing the LDPC encoding may comprise unbalanced lifting of the parity check matrix prior to encoding the input data streams utilising the parity check matrix.

The unbalanced lifting of the parity check matrix may comprise replacing elements of the sub-parity check matrices based on a replacement mapping pattern.

The elements may be replaced by a sub-matrix.

The elements may be replaced based on a value of the elements and a location of the elements in the sub-parity check matrices.

The unbalanced lifting may comprise controlling a row degree, a column degree or both of each of the sub-parity check matrix.

The method may comprise M input streams of M different classes, and the parity check matrix may have M layers, each layer of the parity check matrix corresponding to one of the M classes.

The parity check matrix may further comprise a plurality of connection matrices, each connection matrix linking two of the M layers such that correlation information between the two layers is included during the LDPC encoding.

The parity check matrix may be a block-wise low triangular matrix, with the sub-parity check matrices located as blocks along a main diagonal of the parity check matrix.

The connection matrices may be located as blocks below the main diagonal of the parity check matrix, with blocks above the main diagonal being zero matrices.

Each class may be determined based on one or more of a group consisting of bit error rates, data transmission rates, quality of service (QoS) requirements, number of transmission antennas and transmission conditions.

In accordance with a second aspect of the present invention, there is provided a transmitter in a multiple input multiple output (MIMO) system, the transmitter comprising, one or more input units for receiving multiple input data streams; a low density parity check (LDPC) encoder; a spatial mapping unit; wherein the LDPC encoder performs LDPC encoding of the input data streams utilising a parity check matrix and the parity check matrix comprises a plurality of sub-parity check matrices for encoding respective ones of the input data streams and the spatial mapping unit performs space time encoding for transmitting the LDPC encoded input data streams over a plurality of antennas.

The LDPC encoder may perform unbalanced lifting of the parity check matrix prior to encoding the input data streams utilising the parity check matrix.

The unbalanced lifting of the parity check matrix may comprise replacing elements of the sub-parity check matrices based on a replacement mapping pattern.

The LDPC encoder may replace the elements with a sub-matrix.

The LDPC encoder may replace the elements based on a value of the elements and a location of the elements in the sub-parity check matrices.

The unbalanced lifting may comprise controlling a row degree, a column degree or both of each of the sub-parity check matrix.

The multiple input data streams may comprise M input streams of M different classes, and the parity check matrix may have M layers, each layer of the parity check matrix corresponding to one of the M classes.

The parity check matrix may further comprise a plurality of connection matrices, each connection matrix linking two of the M layers such that correlation information between the two layers is included during the LDPC encoding.

The parity check matrix may be a block-wise low triangular matrix, with the sub-parity check matrices located as blocks along a main diagonal of the parity check matrix.

The connection matrices may be located as blocks below the main diagonal of the parity check matrix, with blocks above the main diagonal being zero matrices.

Each class may be determined based on one or more of a group consisting of bit error rates, data transmission rates, quality of service (QoS) requirements, number of transmission antennas and transmission conditions.

In accordance with a third aspect of the present invention, there is provided a computer readable data storage medium having stored thereon computer code means for instructing a multiple input multiple output (MIMO) system to execute a method for data transmission in the MIMO system, the method comprising: receiving multiple input data streams; performing low density parity check (LDPC) encoding of the input data streams utilising a parity check matrix, wherein the parity check matrix comprises a plurality of sub-parity check matrices for encoding respective ones of the input data streams; and performing space time encoding for transmitting the LDPC encoded input data streams over a plurality of antennas.

In accordance with a fourth aspect of the present invention, there is provided a method for processing received data streams in a multiple input multiple output (MIMO) system, the method comprising, receiving data streams via a plurality of receive antennas; performing space time decoding on the received data streams; and performing low density parity check (LDPC) decoding of the received data streams utilising a parity check matrix, wherein the parity check matrix comprises a plurality of sub-parity check matrices for decoding the data streams.

The method may further comprise using a sum-product method for decoding the received data streams.

In accordance with a fifth aspect of the present invention, there is provided a receiver in a multiple input multiple output (MIMO) system, the receiver comprising, a plurality of receive antennas for receiving data streams; a spatial mapping decoder for performing space time decoding on the received data streams; and a low density parity check (LDPC) decoder for decoding the received data streams utilising a parity check matrix, wherein the parity check matrix comprises a plurality of sub-parity check matrices for decoding the data streams.

The LDPC decoder may comprise one or more sum-product decoders.

In accordance with a sixth aspect of the present invention, there is provided a computer readable data storage medium having stored thereon computer code means for instructing a multiple input multiple output (MIMO) system to execute a method for processing received data streams in the MIMO system, the method comprising: receiving data streams via a plurality of receive antennas; performing space time decoding on the received data streams; and performing low density parity check (LDPC) decoding of the received data streams utilising a parity check matrix, wherein the parity check matrix comprises a plurality of sub-parity check matrices for decoding the data streams.

BRIEF DESCRIPTION OF THE DRAWINGS

Embodiments of the invention will be better understood and readily apparent to one of ordinary skill in the art from the following written description, by way of example only, and in conjunction with the drawings, in which:

FIGS. 7(a) and 7(b) show matrices for illustrating examples of a layer LDPC code.

DETAILED DESCRIPTION

Figure 1:
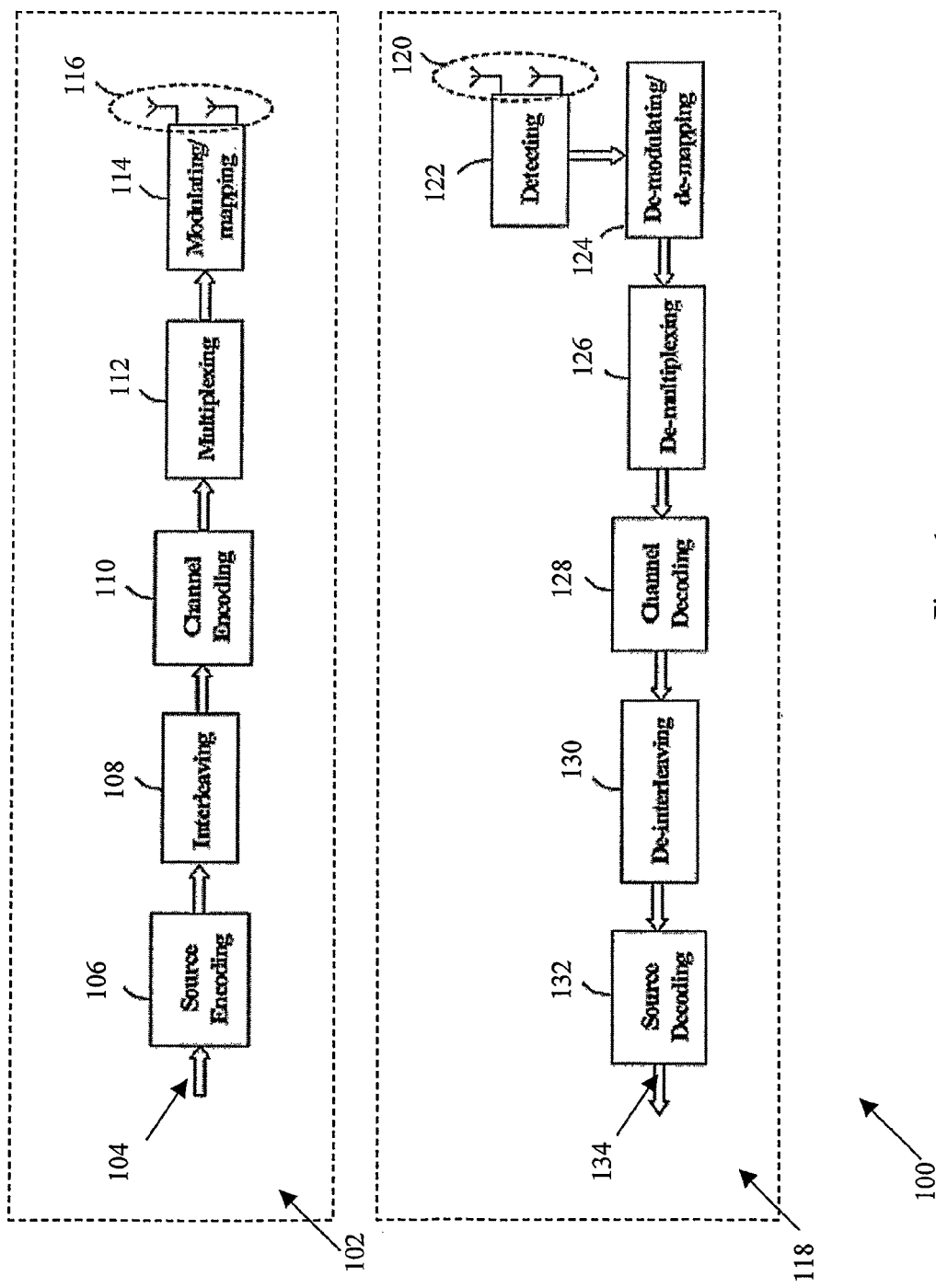
FIG. 1 is a schematic block diagram broadly illustrating a wireless communication system in an example implementation.

Some portions of the description which follows are explicitly or implicitly presented in terms of algorithms and functional or symbolic representations of operations on data within a computer memory. These algorithmic descriptions and functional or symbolic representations are the means used by those skilled in the data processing arts to convey most effectively the substance of their work to others skilled in the art. An algorithm is here, and generally, conceived to be a self-consistent sequence of steps leading to a desired result. The steps are those requiring physical manipulations of physical quantities, such as electrical, magnetic or optical signals capable of being stored, transferred, combined, compared, and otherwise manipulated.

Unless specifically stated otherwise, and as apparent from the following, it will be appreciated that throughout the present specification, discussions utilizing terms such as "scanning", "calculating", "determining", "replacing", "generating", "initializing", "outputting", or the like, refer to the action and processes of a computing system, or similar electronic device, that manipulates and transforms data represented as physical quantities within the computing system into other data similarly represented as physical quantities within the computing system or other information storage, transmission or display devices.

The present specification also discloses an apparatus for performing the operations of the methods. Such apparatus may be specially constructed for the required purposes, or may comprise a general purpose computer or other devices selectively activated or reconfigured by a computer program stored in the computer. The algorithms presented herein are not inherently related to any particular computer or other apparatus. Various general purpose machines may be used with programs in accordance with the teachings herein. Alternatively, the construction of more specialized apparatus to perform the required method steps may be appropriate.

In addition, the present specification also implicitly discloses a computer program, in that it would be apparent to the person skilled in the art that the individual steps of the method described herein may be put into effect by computer code. The computer program is not intended to be limited to any particular programming language and implementation thereof. It will be appreciated that a variety of programming languages and coding thereof may be used to implement the teachings of the disclosure contained herein. Moreover, the computer program is not intended to be limited to any particular control flow. There are many other variants of the computer program, which can use different control flows without departing from the spirit or scope of the invention.

Furthermore, one or more of the steps of the computer program may be performed in parallel rather than sequentially. Such a computer program may be stored on any computer readable medium. The computer program when loaded and executed on a general-purpose computer effectively results in an apparatus that implements the steps of the preferred method.

An example implementation may provide techniques for signal processing in a physical layer to support simultaneous transmission of multiple content data with different BERs. The example implementation may be implemented in any suitably arranged wireless MIMO system. The wireless communication of the MIMO system may conform to any communications standards.

FIG. 1 is a schematic block diagram broadly illustrating a wireless communication system 100 in the example implementation. At a transmitter 102, source data (at numeral 104) are encoded by source encoder units 106 and interleaved by interleavers 108 to generate information data for transmission. The information data are sent, e.g., in blocks, to channel encoding units 110 to perform channel coding and rate matching. The coded data are sent to multiplexing units 112 to multiplex the data into a plurality of data streams. The multiplexed data streams are sent to modulating and mapping units 114 to generate modulated data streams. The modulated data streams are then transmitted by a plurality of transmit antennas 116 to a receiver 118.

At the receiver 118, the transmitted signals are received by a plurality of receive antennas 120 and sent to a detecting unit 122 that detects and separates the received signals into a plurality of detected data streams. The detected data streams are sent to demodulating and demapping units 124 for demodulation and demapping to generate demodulated data streams. The demodulated data streams are sent to de-multiplexing units 126 to de-multiplex the data into a plurality of demultiplexed data streams. The demultiplexed data streams are sent into channel decoding units 128 to recreate the information data. The recreated information data are then de-interleaved by deinterleaving units 130 and sent to source decoder units 132 to recover the transmitted source data (at numeral 134).

Figure 2:
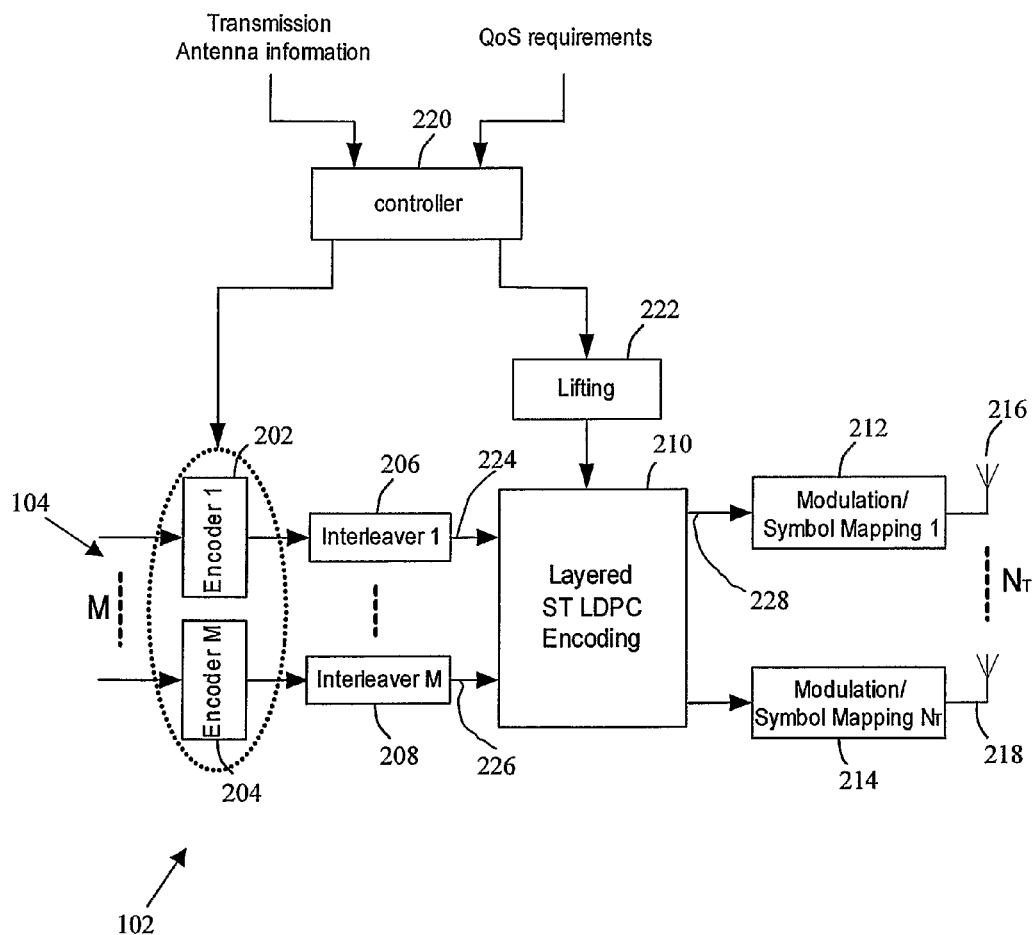
FIG. 2 is a schematic block diagram illustrating a transmitter.

FIG. 2 is a schematic block diagram illustrating the transmitter 102. In the example implementation, the transmitter 102 employs source/channel coding schemes with various space-time processing techniques to provide unequal error protection for different content data. The input data (received at one or more input members at numeral 104) e.g., corresponding to MBMS services are classified into different classes, namely higher priority input data and lower priority input data, based on e.g. requirement of quality and/or data rate. For example, services or data that require low BERs are denoted as higher priority services or data while on the other hand, services or data that can tolerate high BERs are denoted as lower priority service or data.

Classes may also be based on, but not limited to, data transmission rates, quality of service (QoS) requirements, the number of transmission antennas and transmission conditions.

The M input data streams (received at one or more input units at numeral 104) with different priority are encoded by M source encoders 202, 204. The source encoders 202, 204 may be different or the same as any encoder known to a person skilled in the art. Outputs of the M source encoders 202, 204 are sent to M interleaver units 206, 208 to be interleaved. The interleaver units 206, 208 may be the same or different.

Interleaved data from the interleaver units 206, 208 are input into a layer ST LDPC encoding unit 210. The layer ST LDPC encoding unit 210 encodes the different priority data with different code rates and/or different codeword lengths and maps the encoded data into a plurality ($N_T$) of transmit antenna streams. The data distributed to the $N_T$ transmit antenna streams are modulated/symbol mapped using $N_T$ modulation/symbol mapper unit 212, 214 before the data are sent to $N_T$ transmit antennas 216, 218. The modulation/symbol mapper units 212, 214 perform symbol mapping with respect to the data using various modulation schemes. The output data of the modulation/symbol mapper units 212, 214 are transmitted from the transmitter 102 using the $N_T$ transmit antennas 216, 218.

To adapt to different BER requirements and the number of available transmission antennas for transmission, the selection of source encoders 202, 204 and the design of the layer ST LDPC encoding unit 210 can change accordingly to achieve the desired BER and/or capacity. Therefore, a controller 220 is provided to control the design of both the layer LDPC coding and spatial mapping according to input QoS requirements and transmission antenna information. A lifting unit 222 receives control information output from the controller 220 and controls lifting for the layer ST LDPC encoding unit 210. This enables the layer ST LDPC encoding unit 210 to perform the lifting LDPC coding according to the variation of transmission requirements and transmission conditions. In other words, in order to perform the lifting LDPC space-time coding, a lifting LDPC coding is performed with respect to data input into the layer ST LDPC encoding unit 210 using LDPC codes having superior performance. The lifting LDPC coding is under the control of the lifting unit 222 and is based on the control information sent from the controller 220.

In the example implementation, the lifting unit 222 comprises a table (see Table 1 below) containing a plurality of replacement mapping patterns and each pattern determines sub-matrices that are used for lifting. The lifting unit 222 receives a pattern ID from the controller 220 and selects a corresponding mapping pattern to perform lifting.

TABLE 1

Figure 10A:
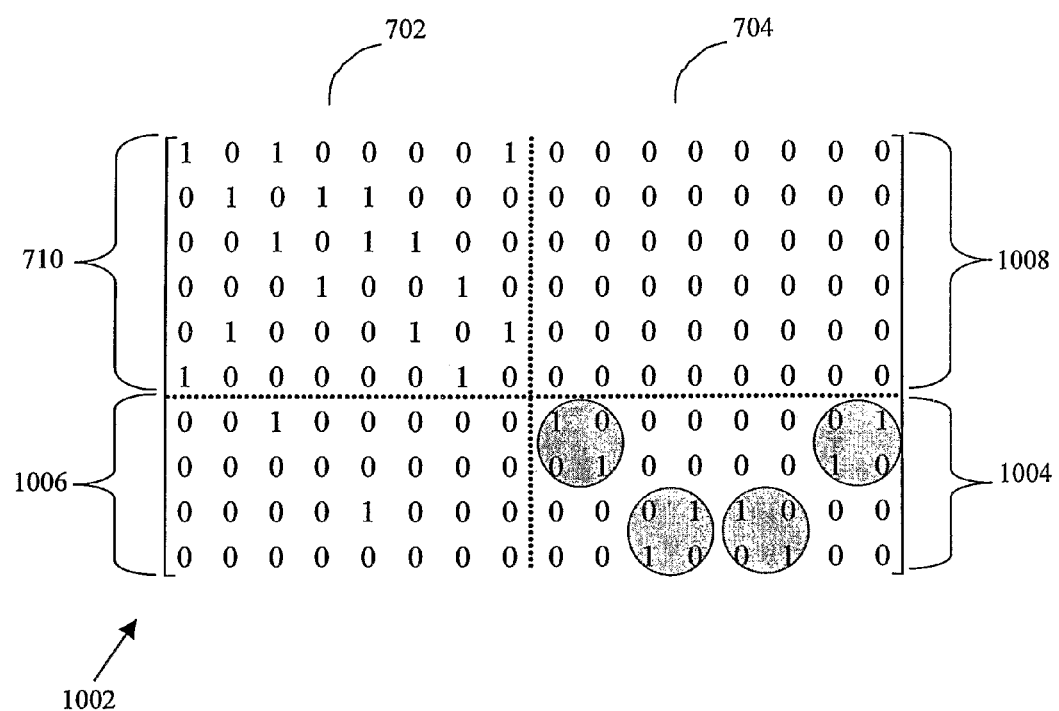
FIGS. 10(a), (b) and (c) show matrices for illustrating examples of unbalanced-lifting in an example implementation.
Figure 10B:
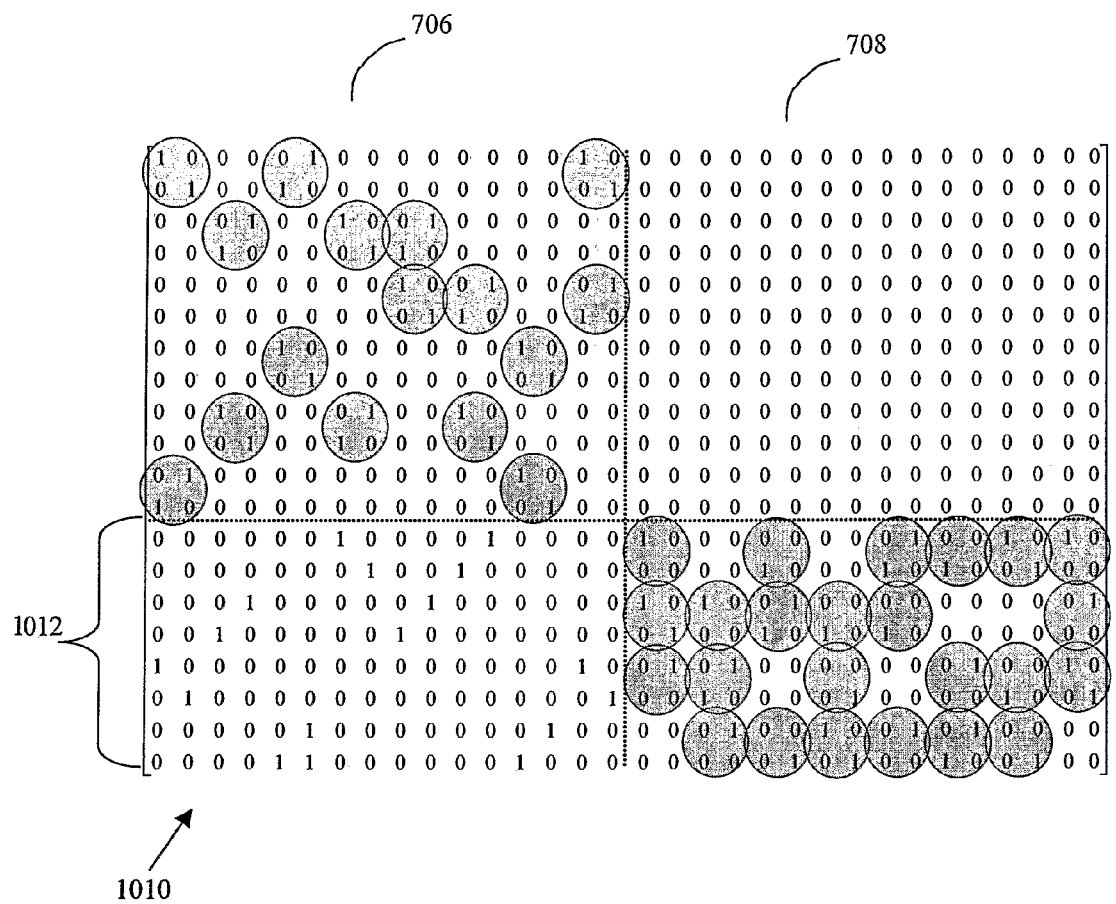
Figure 10C:
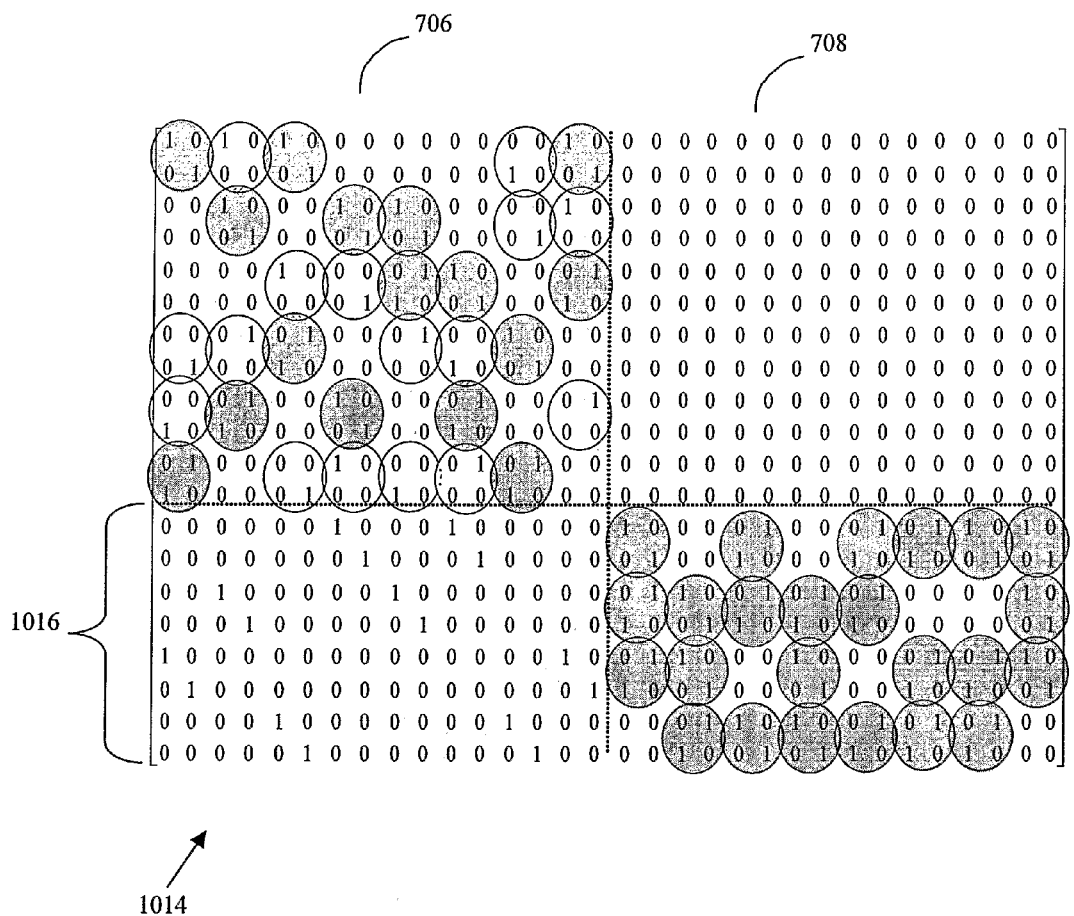

| Pattern ID | Lifted parity check matrix |
| --- | --- |
| 1 | (As shown in FIG. 10(a)) |
| 2 | (As shown in FIG. 10(b)) |
| 3 | (As shown in FIG. 10(c)) |

The replacement mapping patterns may link a location (i.e., row and column) and/or a value (i.e., 0 or 1) of an element of the parity check matrix to a sub-matrix for replacing the element.

Based on the above, the example implementation encodes the M classes of information data with different priorities by using a layered LDPC channel coding code that comprises M layers. The channel coding code encodes each layer with a different code rate and/or codeword length according to desired protection requirements. The channel coding code then combines and maps systematic data and parity data from the M layers of encoded data to a plurality of transmission antennas with different diversity gain in the space, time and/or frequency domain.

Figure 3:
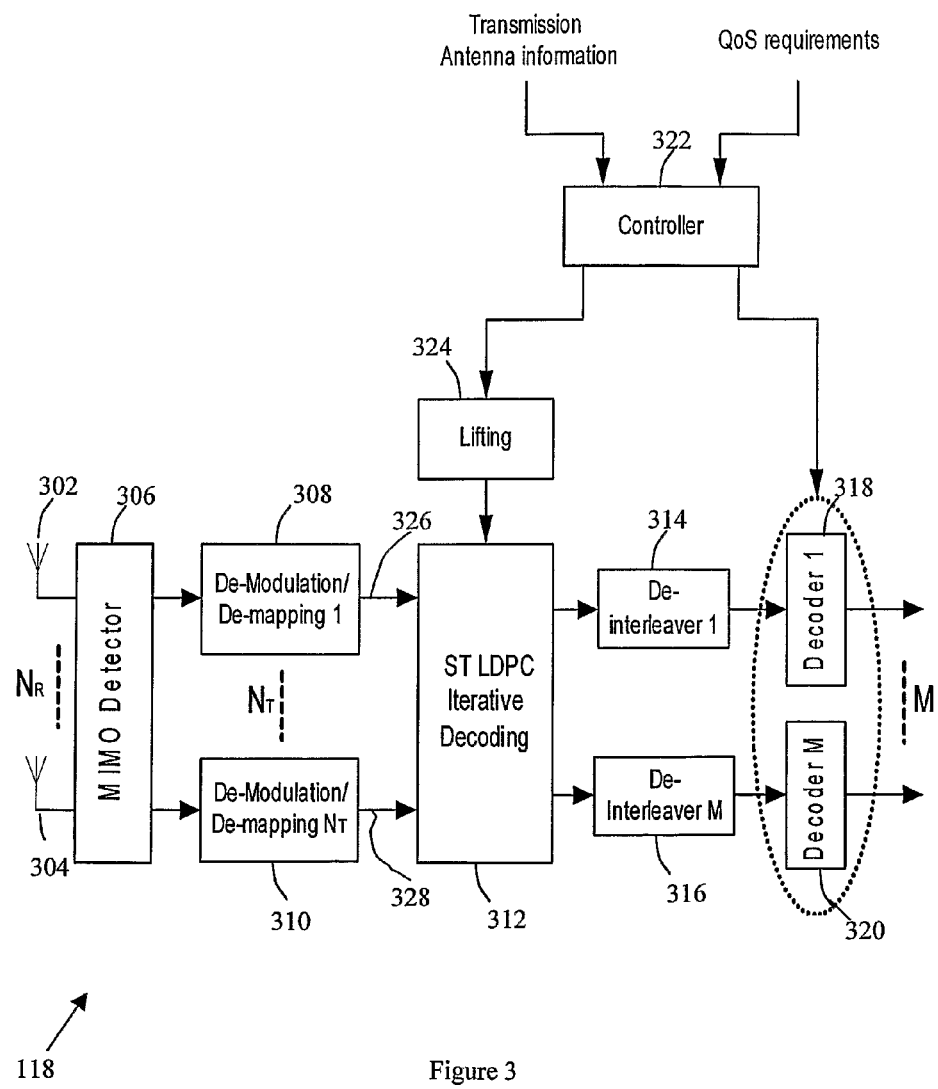
FIG. 3 is a schematic block diagram illustrating a receiver.

FIG. 3 is a schematic block diagram illustrating the receiver 118. At the receiver 118, signals received at a plurality of ($N_R$) receiver antennas 302, 304 are first combined and then applied to a MIMO detector 306 to recover the signals transmitted from the transmitter 102 (FIG. 2). The MIMO detector 306 can be operated in a number of ways known to a person skilled in the art. An example is to use a linear estimator matrix constructed by using the channel information to effectively separate the plurality of transmitted signals arriving at the receiver antennas 302, 304. Another example is to use optimal techniques based on maximum likelihood (ML) or maximum a posteriori (MAP) algorithms. In addition, minimum mean square error (MMSE) and decision-feedback detection methods may be used for the MIMO detector 306 to reduce system complexity.

The signals transmitted by the transmitter antennas 216, 218 (FIG. 2) are detected and split into $N_T$ branches by the MIMO detector 306. Demapping and demodulation operations are performed on the split signals in each branch using respective demodulation/demapping units 308, 310. After demapping and demodulation, all the signals of the $N_T$ branches are sent to a ST LDPC iterative decoding unit 312 to recreate the M layers signals that correspond to the M classes of source encoded and interleaved data transmitted from the transmitter 102 (compare layer ST LDPC encoding unit 210).

The M channel decoded data streams are output from the ST LDPC iterative decoding unit 312 and deinterleaved using deinterleaver units 314, 316. The selection of the deinterleaver units 314, 316 is dependent on the interleaver units 206, 208 (FIG. 2) used at the transmitter 102 (FIG. 2). The deinterleaved data are sent to source decoder units 318, 320 to recreate the M classes of source data. The types of the decoder units 318, 320 are dependent on the source encoder units 202, 204 (FIG. 2) used at the transmitter 102 (FIG. 2).

In the receiver 118, a controller unit 322 is provided to perform source decoding and ST layered LDPC decoding according to desired QoS requirements and transmission antennas information. A lifting unit 324 receives control information output from the controller unit 322 and controls the ST LDPC iterative decoding unit 312 to enable the ST LDPC iterative decoding unit 312 to perform the lifting LDPC decoding according to variations of transmission requirements and transmission conditions. In other words, in order to perform the lifting LDPC space-time decoding corresponding to the lifting LDPC coding at the transmitter 102 (FIG. 2), a lifting LDPC decoding is performed with respect to data input into the ST LDPC iterative decoding unit 312 using LDPC codes associated with the LDPC codes used in the transmitter 102 (FIG. 2).

Figure 4:
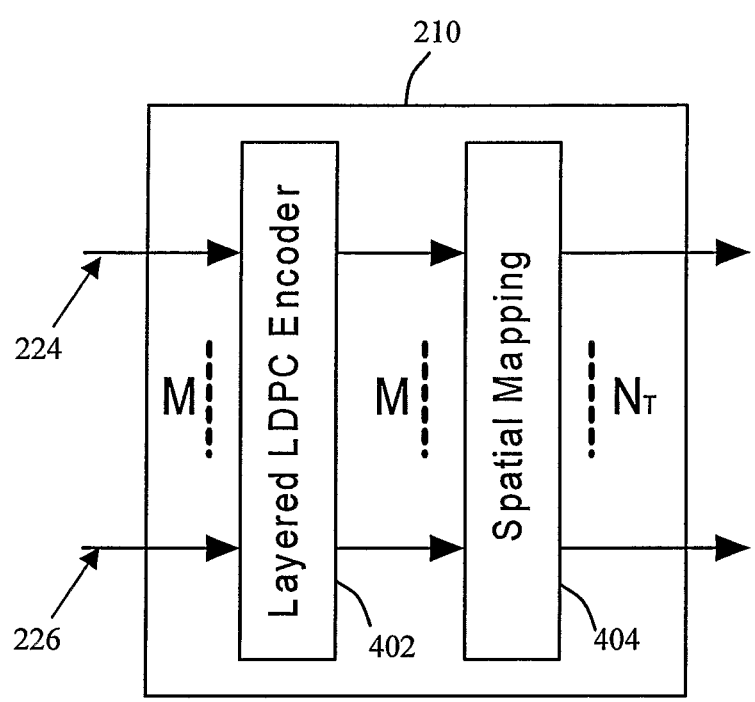
FIG. 4 is a block diagram illustrating a layer space-time (ST) low density parity check (LDPC) encoder unit.

FIG. 4 is a block diagram illustrating the layer ST LDPC encoding unit 210. The layer ST LDPC encoding unit 210 comprises a layered LDPC encoder 402 and a spatial mapping unit 404. The input data (at numerals 224, 226) are first encoded by the layered LDPC encoder 402. The layered LDPC encoder 402 comprises M designed layers and each layer is used for encoding each class of input data with a different code rate and different codeword length. After encoding, the M encoded data are sent to the spatial mapping unit 404. The spatial mapping unit 404 performs multiplexing and/or demultiplexing operations on the M data streams and then maps them into a plurality of transmit antenna streams according to a designed mapping scheme.

Figure 5:
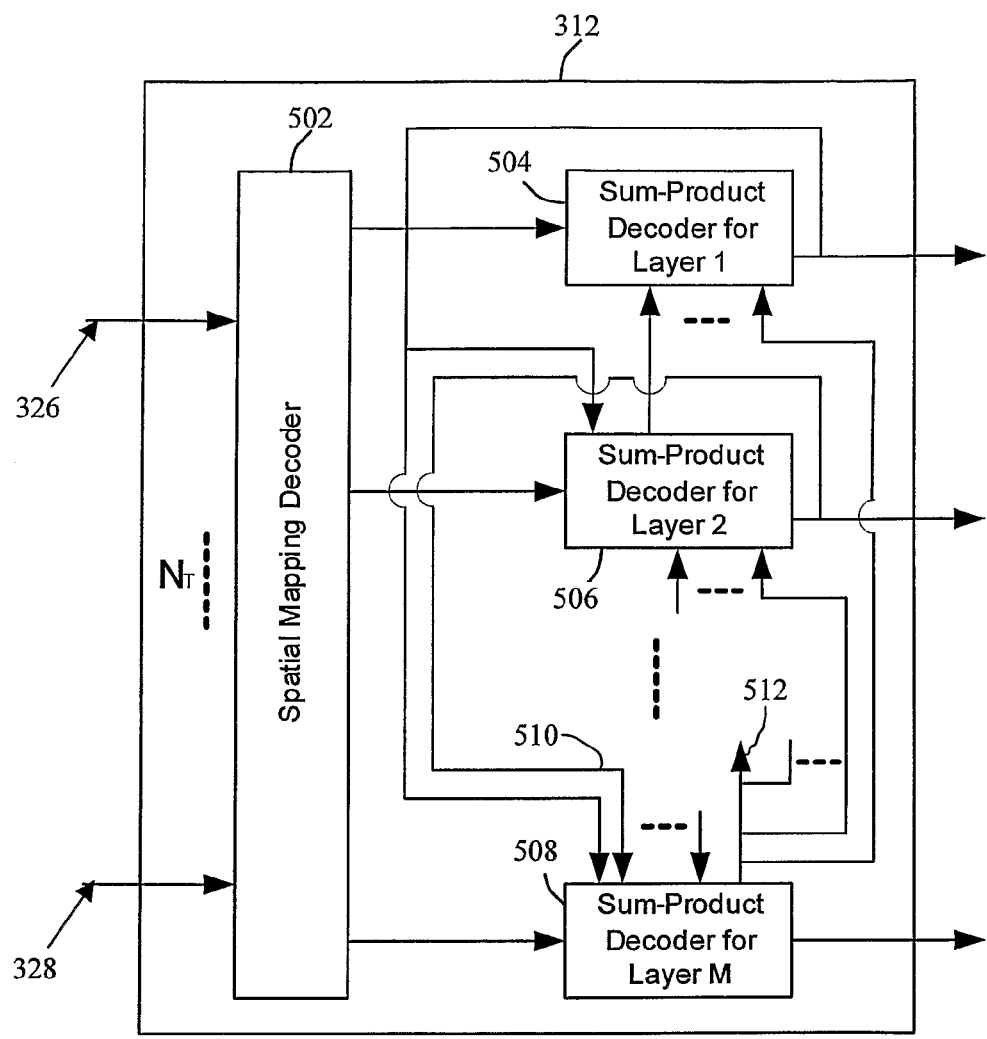
FIG. 5 is a block diagram illustrating a ST LDPC iterative decoding unit.

FIG. 5 is a block diagram illustrating the ST LDPC iterative decoding unit 312. The ST LDPC iterative decoding unit 312 receives $N_T$ input demodulated signals (at numerals 326, 328) and performs decoding operations based on the encoding performed by the layered ST LDPC encoder unit 210 (FIG. 4) to output recreated M classes of transmitted data. The ST LDPC iterative decoding unit 312 comprises a spatial mapping decoder 502 and a LDPC decoder in the form of M sum-product decoders 504, 506, 508 for M layers. The input $N_T$ data streams (at numerals 326, 328) are input to the spatial mapping decoder 502 which performs an inverse of the operations of the spatial mapping unit 404 (FIG. 4). Therefore, the $N_T$ data streams are demultiplexed and/or multiplexed to obtain M data streams corresponding to the designed mapping scheme.

The decoded M streams are output from the spatial mapping decoder 502 and input to the M sum-product decoders 504, 506, 508 such that each sum-product decoder e.g. 506 decodes each input data stream with the information from the preceding sum-product decoder e.g. 504. In other words, an ith sum-product decoder receives an ith input data stream and the information from the results of the first to the (i−1)th sum-product decoders. Based on the information, the ith sum-product decoder then performs iterative sum-product decoding to recreate an ith layer data that corresponds to an ith class of data with ith priority.

The example implementation described above may provide unequal error protection to different data with different priorities. In the following description, more details of the layered ST LDPC encoding, decoding and spatial mapping techniques are provided.

Figure 6:
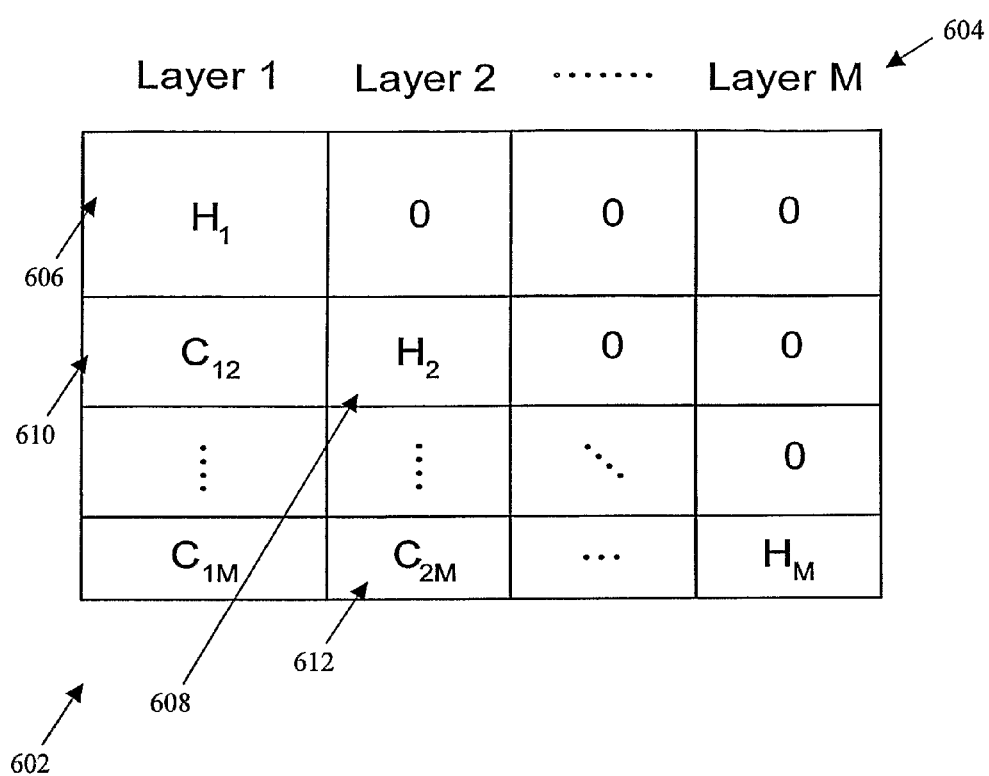
FIG. 6 illustrates a layered structure of a parity check matrix of a LDPC code used in an encoder.

FIG. 6 illustrates a layered structure of a parity check matrix 602 of the LDPC code used in the encoder 402 (FIG. 4). The LDPC code may be represented by the low density parity check matrix H 602. The low density parity check matrix H 602 is designed as a block-wise low triangular matrix. The matrix H 602 can be divided into layers (see numeral 604) to implement layer coding for each layer data with different quality and/or rate requirements e.g., different code rates, different codeword lengths and/or different check degrees.

As illustrated in FIG. 6, the parity check matrix H 602 is constructed with M layers. For each ith layer, there is provided a sub-matrix $H_i$ e.g. 606 which can be a sub parity check matrix that performs sub-coding for each ith layer information. There is also provided consecutive blocks $C_{i,j}$ (j=i+1, ..., M) e.g., 610 which are correlated to other layers. A valid binary codeword b satisfies $Hb^T=0$. For each different layer, the corresponding sub matrix $H_i$ can have a different number of rows and columns from other sub-matrices. Therefore, the codeword b is also constructed with M layers. Each layer of the codeword b can have a different length of codeword and the code rates may be different for different layers. A matrix $C_{i,j}$ represents correlated information to link layers i and j.

Based on the property of LDPC codes, bits (or variable nodes) of the codeword b with higher degrees are better protected. In the example implementation, the connection matrices $C_{i,j}$ (j=i+1, ..., M) may be regarded as elements that add degrees to the bits in the ith layer such that the bits mapped to the ith layer may be provided with better error protection as compared to the bits mapped to the (+1)th layer. Therefore, layers from high to low (i.e., corresponding to mapped bits from high priority to low priority) are arranged from left to right in the parity check matrix H 602. In addition, the data nodes of higher layer data may have higher connection degrees due to the quasi low triangular structure of the parity check matrix H 602.

In the example implementation, the bits from M classes are mapped to (i.e., encoded by) M layers respectively and the order of the priorities (from highest to lowest) are the same as the order of layers (i.e., from Layer 1 to Layer M) so as to employ the unequal error protection property of the described layered LDPC code. On the other hand, the code rates resulting from each sub parity check matrix $H_i$ are increasing according to the order of layers such that different bits of different priority (e.g., from highest to lowest) are encoded with different code rates (e.g., from lowest to highest) and thus, may achieve different error protection levels (e.g., from highest to lowest). The codeword length for each layer may be adjusted according to various error probability and/or transmission rate requirements.

Assume that the codeword length of an ith layer is $n_i$ and the number of parity check bits is $r_i$. That is, the sub parity-check matrix $H_i$ is a matrix with $r_i$ rows and $n_i$ columns. For each layer, a $(n_i-r_i) \times 1$ vector of input information bits $s_i$ is encoded to a $n_i \times 1$ codeword. The encoding for the first layer is shown below. By performing transportation, $$W_1 H_1 = (P_1 I) \qquad \text{eq. (1)}$$

where matrix $W_1$ is a $r_1 \times r_1$ full rank matrix performing transportation on the matrix $H_1$, $P_i$ is a $r_1 \times (n_1-r_1)$ matrix and the matrix I is the $r_1 \times r_1$ identity matrix. In the example implementation, transportation relates to a matrix representation of linear transportation performed on $H_1$. Transportation is performed such that a generator matrix $P_1$ may be obtained for use in coding. Such operations are used for linear block coding. It will be appreciated by a person skilled in the art that LDPC is a form of linear block coding. Based on the above, the codeword $b_1$ for the $1^{st}$ layer is formed by $$b_1 = (s_1(s_1 P_1^T)) \qquad \text{eq (2)}$$

Therefore, the linear block coding is expressed by the parity check matrix $H_1$ and the generator matrix $P_1$ is used for encoding $s_1$ to generate parity bits.

For the ith layer, similarly, by performing transportation, $$W_i H_i = (P_i I) \qquad \text{eq. (3)}$$

and the codeword for the ith layer is formed by $$b_i = \left(s_i \left(s_i P_i^T + \sum_{j<i} b_j C_{j,i}^T W_i^T\right)\right) \qquad \text{eq. (4)}$$

During the encoding for the ith layer, parts of information of previous layers are injected into the codeword of the ith layer by connection matrices $C_{j,i}$ (j=1, ..., i−1).

In the example implementation, decoding for each layer is performed by a sum-product method in the order of layers (i.e., from Layer 1 to Layer M.) That is, higher layer data with higher error protection is decoded first to improve decoding performance. The parity check equation for the first layer is $$H_1 b_1^T = 0 \qquad \text{eq. (5)}$$

Eq. (5) is satisfied when the iterations are terminated for the first layer decoding. Consequently, the parity check equation for an ith layer is $$\sum_{j<i} C_{j,i} b_j^T + H_i b_i^T = 0 \qquad \text{eq. (6)}$$

During LDPC decoding, the so-called belief propagation is terminated when all parity check equations are satisfied. In the example implementation, the belief propagation is terminated when the parity check equations involving only detected layers and the layer to be detected are satisfied. In other words, the belief propagation is stopped for ith layer decoding when the $1^{st}$ to ith parity check equations are satisfied.

In the example implementation, in addition to using belief propagation, the decoding procedure is also iterative among the layers. An iterative decoding among the layers may improve the decoding performance gradually. In each such iteration, for an ith layer decoding, message passing is performed from higher layers (i.e., received from $1^{st}$ to i−1th layers) for verifying the parity check equation. Message passing is also performed from lower layers (i.e., sent to the i+1th to M th layers) for computing the log-likelihood ratio (LLR). The message passing in different directions (see e.g., 510, 512 in FIG. 5) among layers may provide faster and more reliable decoding in the example implementation. The decoding procedure is terminated either when all the involved parity check equations are satisfied (i.e., belief propagation terminated) or when convergence of the LLRs is achieved.

FIGS. 7(*a*) and 7(*b*) are matrices 700, 701 for illustrating examples of the layer LDPC code of FIG. 6. For description purposes, it is assumed that there are two classes of information bits $s_1$ and $s_2$. Bits of first class $s_1$ have higher priority and require better error protection while bits of second class $s_2$ have lower priority and require less robust protection. Thus, the bits of first class $s_1$ are encoded by a first layer of LDPC code and the bits of second class $s_2$ are encoded by a second layer of LDPC code. The codeword u of the first layer (compare eq. (2)) is obtained as $$u = (s_1(s_1 P_1^T)) \qquad \text{eq (7)}$$

The codeword v of the second layer (compare eq. 14) is obtained as $$v = (s_2(s_2 P_2^T + u C_{12}^T W_2^T)) \qquad \text{eq. (8)}$$

As illustrated in FIG. 7(*a*), in a first example, the sub-parity check matrix $H_1$ 710 has a size of 6×8. Since codeword length is related to the number of columns, the codeword length of the first layer 702 is 8 bits. Since the number of parity bits is related to the number of rows, the number of parity bits for the first layer 702 is 6 bits. Therefore, based on the codeword length and the number of parity bits, the number of information bits for the first layer codeword is 2 bits. Consequently, the code rate for the first layer 702 is ⅖ (i.e., ¼). Using the same reasoning, the codeword length for the second layer 704 is 4 bits while the code rate for the second layer 704 is ²⁄₄ (i.e., ½). Therefore, the first layer codeword is 8 bits comprising 2 bits for information bits and 6 bits for parity bits. The second layer codeword is 4 bits comprising 2 bits for information bits and 2 bits for parity bits. That is, $$u = \left( \underbrace{u_1 u_2}_{\text{information bits}}  \underbrace{u_3 u_4 u_5 u_6 u_7 u_8}_{\text{Parity bits}} \right) \quad \text{eq. (9)}$$

$$v = \left( \underbrace{v_1 v_2}_{\text{information bits}} \underbrace{v_3 v_4}_{\text{Parity bits}} \right) \quad \text{eq. (10)}$$

Referring to FIG. 7(b), in a second example, the code rate for the first layer 706 is ¼ and the code rate for second layer 708 is ½. The codeword length of the first layer is 8 bits and the codeword length of the second layer is also 8 bits. Therefore, the first layer codeword is 8 bits comprising 2 bits for information bits and 6 bits for parity bits. The second layer codeword is 8 bits comprising 4 bits for information bits and 4 bits for parity bits. That is, $$u = \left( \underbrace{u_1 u_2}_{\text{information bits}} \underbrace{u_3 u_4 u_5 u_6 u_7 u_8}_{\text{Parity bits}} \right) \quad \text{eq. (11)}$$

$$v = \left( \underbrace{v_1 v_2 v_3 v_4}_{\text{information bits}} \underbrace{v_5 v_6 v_7 v_8}_{\text{Parity bits}} \right) \quad \text{eq. (12)}$$

In the above description, each connection matrix is designed to add degree to a higher layer, thus improving the protection for higher layer data. Therefore, the construction of the parity check matrix 602 (FIG. 6), comprising sub parity-check matrices 606, 608 and connection matrices 610, 612, may also be used to control the unequal error protection. The examples illustrated using FIGS. 7(a) and (b) are for describing the layered LDPC concept only. It will be appreciated by a person skilled in the art that, in order to be a sparse matrix; the parity check matrix may be very large in practical applications.

Figure 8:
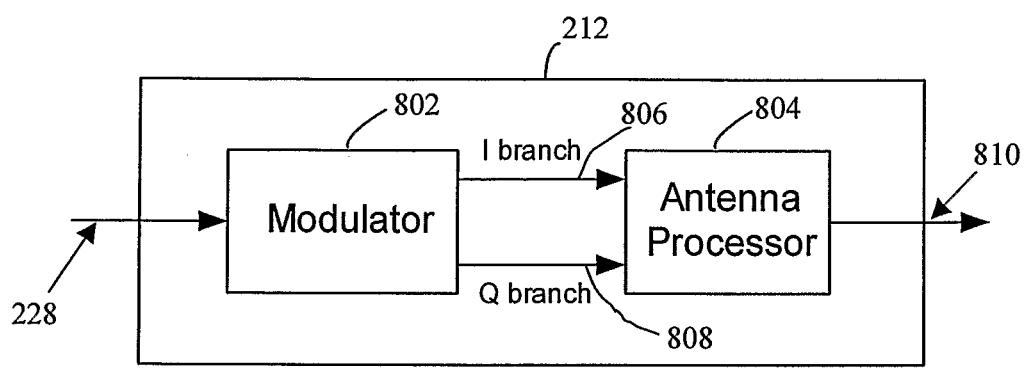
FIG. 8 is a block diagram illustrating a modulation/symbol mapping unit.

FIG. 8 is a block diagram illustrating the modulation/symbol mapping unit 212 (FIG. 2). The other modulation/symbol mapping units e.g. 214 function substantially identical to the modulation/symbol mapping unit 212. Input data at numeral 228 are modulated by a modulator 802 utilizing a modulation scheme, that modulates the input data in terms of the in-phase and quadrature phase components to transmit different subsets of the data. An antenna processor 804 is provided to arrange the I-branch 806 and Q-branch 808 data to the antenna transmission stream at numeral 810. The antenna processor 804 may provide orthogonal (or near-orthogonal) signal spreading for transmit diversity in wireless transmissions.

It will be appreciated by a person skilled in the art that demodulation and demapping operations performed by the demodulation/demapping units 308, 310 (FIG. 3) are inverse processing of the modulation and mapping operations described above.

Figure 9A:
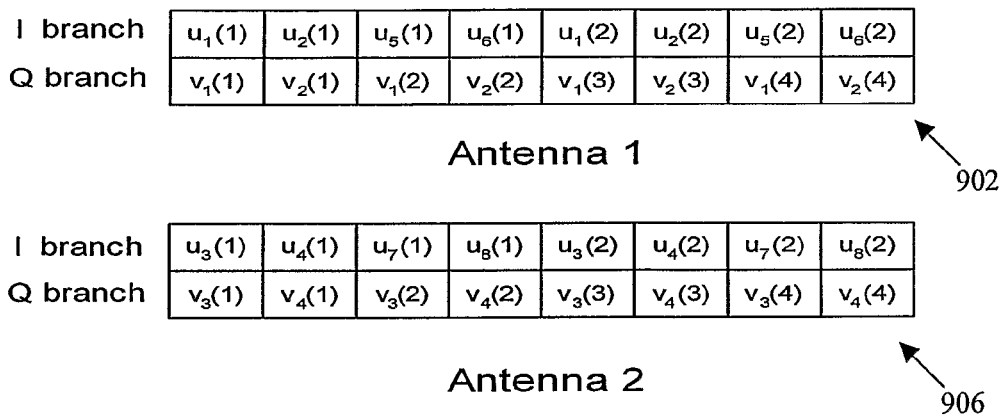
FIGS. 9(a) and (b) are I-branch/Q-branch tables for illustrating signal mapping formats of the LDPC coded data using two transmission antennas.

FIGS. 9(a) and (b) are I-branch/Q-branch tables 902, 904, 906, 908 for illustrating signal mapping formats of the LDPC coded data using $N_T=2$ transmission antennas. The signal mapping formats are in association with the LDPC code examples of FIGS. 7(a) and (b). Spatial mapping performed by the spatial mapping unit 404 (FIG. 4) is used to map M layers encoded data into $N_T$ (i.e., the number of antennas) transmission streams. Using the signal mapping formats described below, the bits from each layer data are distributed in as many symbols as possible to achieve higher frequency diversity.

Figure 9B:
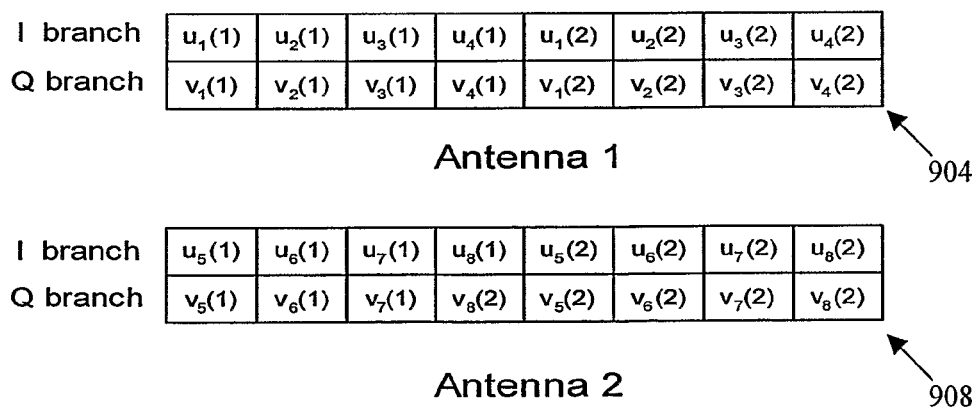

Using the layer ST LDPC encoding unit 210 (FIG. 4) and the modulation/symbol mapping unit 212 (FIG. 8), signal mapping formats are provided to map M classes of information bits to $N_T$ transmission streams with Quadrature Phase Shift Keying (QPSK) modulation. In FIG. 9(a), a signal mapping format is used in association with the LDPC codes of FIG. 7(a) to map two (i.e., M=2) classes of information bits to (i.e., $N_T=2$) two antenna transmission streams. In FIG. 9(b), another signal mapping format is used in association with the LDPC codes of FIG. 7(b) to map two (ie. M=2) classes of information bits to (i.e., $N_T=2$) two antenna transmission streams.

Using the signal mapping formats illustrated using FIG. 9(a) and FIG. 9(b), information bits and some parity bits of class 1 and information bits of class 2 are mapped to a first antenna transmission stream (compare Table 902 with elements of eq. (9) and (10) and Table 904 with elements of eq. (11) and (12)). The remaining parity bits of class 1 and the parity bits of class 2 are mapped to a second antenna transmission stream (compare Table 906 with elements of eq. (9) and (10) and Table 908 with elements of eq. (11) and (12)). By implementing the signal mapping formats, the two classes of bits are distributed in every symbol to achieve higher frequency diversity for Orthogonal Frequency Division Multiplexing (OFDM) transmission. As illustrated in the above examples, the first class data with higher priority are provided better error protection (e.g., more parity bits) and in the example illustrated in FIG. 9(a), the second class data with lower priority achieve a higher transmission rate (i.e., transmission of $v_1(1)$, $v_2(1)$ to $v_1(4)$, $v_2(4)$ in one transmission). The transmissions of subsequent codewords are according to the above signal mapping formats. For example, referring to FIG. 9(a), eqs. (9) and (10), the subsequent codeword bits, ie. $u_x(3)$ to $u_x(4)$ and $v_y(5)$ to $v_y(8)$ where x ranges from 1 to 8 and y ranges from 1 to 4, are transmitted based on the signal mapping formats illustrated by Tables 902 and 906.

The example implementation thus provides a method for lifting an LDPC code according to variations in channel conditions, frame length and/or the number of transmission antennas in a wireless communication system. Structures of the lifting LDPC code used in relation to the layer ST LDPC encoding unit 210 (FIG. 2) and the ST LDPC iterative decoding unit 312 (FIG. 3) are described in more detail below.

In the example implementation, characteristics of a sub-matrix e.g. 606 (FIG. 6), such as the size or density (i.e., ratio of an element) of element "1" in the sub-matrix may vary according to the value and the position of the element to be replaced. If elements with the same value ("1" or "0") but at different positions (i.e., row and/or column) are replaced by sub-matrices with different characteristics, such lifting is termed as unbalanced-lifting.

FIGS. 10(a), (b) and (c) are matrices for illustrating examples of unbalanced-lifting in the example implementation.

Figure 7A:
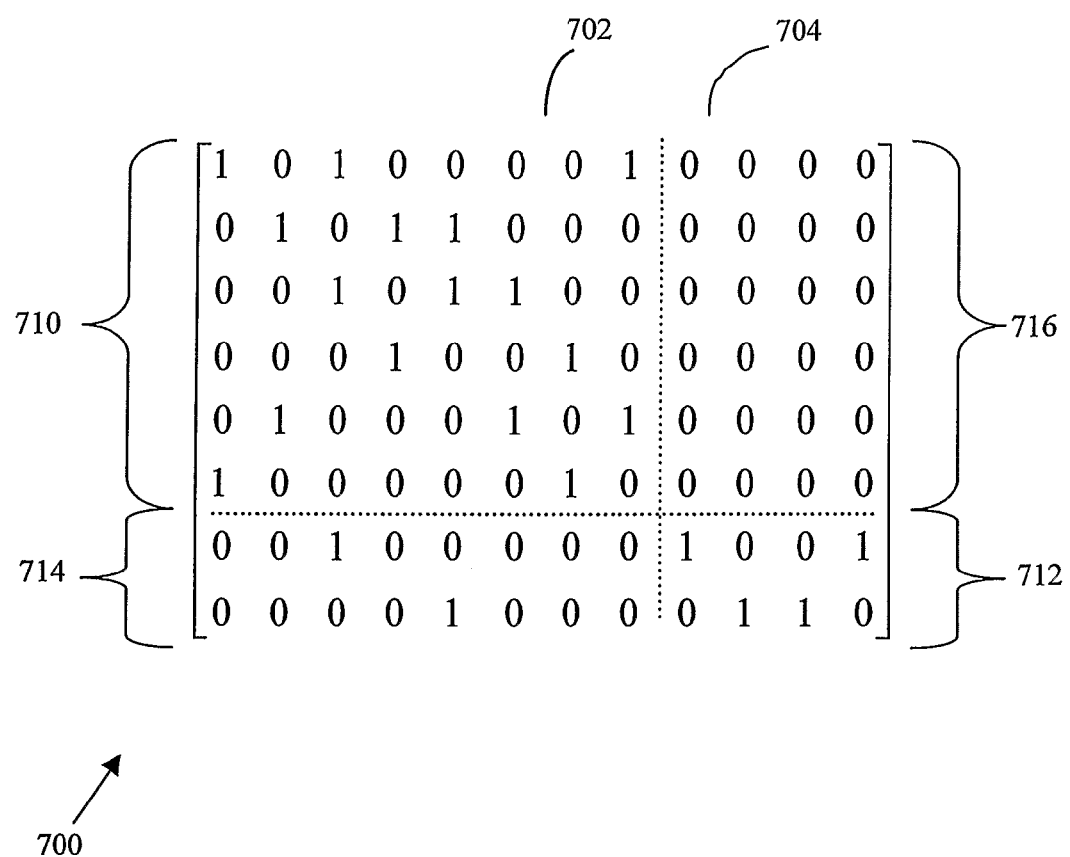

In a first example of unbalance-lifting for layered LDPC illustrated in FIG. 10(a), a lifted matrix 1002 is originated from the parity check matrix 700 (FIG. 7(a)). Referring to FIG. 7(a), for the first layer 702, lifting, i.e. sub-matrix replacement, is not performed to the sub parity check matrix 710. For the second layer 704, lifting with an expansion factor 2, is performed to the sub parity check matrix 712 by replacing the elements with 2×2 sub-matrices (compare 1004 in FIG. 10(*a*)). In order to increase the sub-codeword length (i.e., columns) of the second layer 704 and maintaining the degrees at the same time, in the second layer 704, a sub-matrix for replacing a "0" is a 2×2 zero matrix and a sub-matrix for replacing a "1" is a 2×2 identity matrix or its permutation (compare 1004 in FIG. 10(*a*)). That is, $$0 \longrightarrow \begin{bmatrix} 0 & 0 \\ 0 & 0 \end{bmatrix}, 1 \longrightarrow \bigcirc \text{ or } \bigcirc \qquad \text{eq. (13)}$$

In the example implementation, there are no restrictions on which replacement matrix is used for replacing the elements in the sub parity check matrices. Therefore, for sub parity check matrix 712, replacement for the element "1" may be chosen from the replacement matrices shown in eq. (13).

The lifting sub-matrices for the connection matrix 714 are of size 2×1 (compare 1006 in FIG. 10(*a*)) as $$0 \rightarrow \begin{bmatrix} 0 \\ 0 \end{bmatrix}, 1 \rightarrow \begin{bmatrix} 1 \\ 0 \end{bmatrix} \qquad \text{eq. (14)}$$

Block 716 of the matrix 700 is a zero matrix. During lifting, each of these zero elements is replaced by a 1×2 zero matrix (compare 1008 in FIG. 10(*a*)).

After lifting, the 8×12 parity check matrix 700 is converted to a 10×16 parity check matrix 1002. Accordingly, the sub-codewords for each layer 702, 704 are changed to $$u' = \left( \underbrace{u'_1 u'_2}_{\text{information bits}} \; \underbrace{u'_3 u'_4 u'_5 u'_6 u'_7 u'_8}_{\text{Parity bits}} \right) \qquad \text{eq. (15)}$$

$$v' = \left( \underbrace{v'_1 v'_2 v'_3 v'_4}_{\text{information bits}} \; \underbrace{v'_5 v'_6 v'_7 v'_8}_{\text{Parity bits}} \right) \qquad \text{eq. (16)}$$

In the above example, unbalanced lifting (i.e., using replacement matrices with different characteristics for the same element) is achieved by using replacement matrices with different sizes for lifting in different layers. More particularly, the sub parity check matrix 710 can be considered as being lifted with 1×1 matrices having the same respective values as the elements in the sub parity check matrix 710. For the second layer sub parity check matrix 712, the lifting is performed with 2×2 matrices. The connection matrix 714 is lifted using 2×1 matrices.

Thus, the unbalanced-lifting for layered LDPC as illustrated in FIG. 10(*a*) is achieved by replacing elements of the sub parity check matrix 712 and other matrices in different layers with sub-matrices of different sizes. Therefore, the sub-codeword length of each layer 702, 704 may be controlled independently.

In a second example of unbalanced-lifting illustrated by FIG. 10(*b*), a parity check matrix 1010 is originated from the parity check matrix 701 (FIG. 7(*b*)). Referring to FIG. 7(*b*), for both layers 706, 708, lifting with an expansion factor 2 is performed. That is, each element of the matrix 701 is replaced by a 2×2 sub-matrix. Thus, the sub-codeword lengths (i.e., columns) of both the first layer 706 and the second layer 708 are increased (compare 1010 in FIG. 10(*b*)). To adjust the error protection capability of each layer, the example implementation controls the degree of each layer 706, 708 by using sub-matrices with a different density of 1 in each layer. The sub-matrix for replacing an "0" element in matrix 701 is a zero matrix, while the sub-matrix for replacing "1" in matrix 701 is either an identity matrix, a permuted identity matrix or a low density (i.e., lower than identity matrix) matrix. Thus, for the first layer 706, the replacement sub-matrices are selected as $$0 \longrightarrow \begin{bmatrix} 0 & 0 \\ 0 & 0 \end{bmatrix}, 1 \longrightarrow \bigcirc \text{ or } \bigcirc \qquad \text{eq. (17)}$$

and for the second layer 708, the replacement sub-matrices are selected as $$0 \longrightarrow \begin{bmatrix} 0 & 0 \\ 0 & 0 \end{bmatrix}, 1 \longrightarrow \bigcirc\bigcirc\bigcirc\bigcirc\bigcirc \text{ or } \bigcirc \qquad \text{eq. (18)}$$

A sub-matrix for replacing the remaining "1" elements is either an identity matrix or a permuted identity matrix. (compare 720 and 1012 in FIG. 10(*b*)).

In a third example of unbalanced lifting illustrated by FIG. 10(*c*), a matrix 1014 is expanded from the parity check matrix 701 (FIG. 7(*b*)), where the lifting for both layers 706, 708 is with an expansion factor 2. The difference between this third example and the example of FIG. 10(*b*) is that this third example provides a method for improving the error protection capability of a layer by increasing the degrees of the layer (e.g., the first layer 706). A sub-matrix for replacing some "0" elements in the sub parity check matrix 718 of the matrix 701 is selected as a non-zero matrix. A sub-matrix for replacing "1" is either an identity matrix or a permuted identity matrix. Compare 1014 in FIG. 10(*c*). For the first layer 706, the replacement sub-matrices are selected as $$0 \longrightarrow \begin{bmatrix} 0 & 0 \\ 0 & 0 \end{bmatrix}, \begin{pmatrix} 0 & 1 \\ 0 & 0 \end{pmatrix}, \begin{pmatrix} 0 & 0 \\ 1 & 0 \end{pmatrix}, \begin{pmatrix} 1 & 0 \\ 0 & 0 \end{pmatrix} \text{ or } \begin{pmatrix} 0 & 0 \\ 0 & 1 \end{pmatrix}, 1 \longrightarrow \bigcirc \text{ or } \bigcirc \qquad \text{eq. (19)}$$

and for the second layer 708, the replacement sub-matrices are selected as $$0 \longrightarrow \begin{bmatrix} 0 & 0 \\ 0 & 0 \end{bmatrix}, 1 \longrightarrow \bigcirc \text{ or } \bigcirc \qquad \text{eq. (20)}$$

A sub-matrix for replacing the remaining "1" elements is either an identity matrix or a permuted identity matrix. (compare 720 and 1016 in FIG. 10(*c*)).

After lifting, the 10×16 parity check matrix 701 is converted to a 20×32 lifted parity check matrix 1010 or 1014 as respectively illustrated in FIGS. 10(b) and (c). Based on the lifted LDPC parity check matrices 1010, 1014, the sub-codewords for each layer 706, 708 are changed to $$u' = \left( \underbrace{u'_1 u'_2 u'_3 u'_4}_{\text{information bits}} \underbrace{u'_5 u'_6 u'_7 u'_8 u'_9 u'_{10} u'_{11} u'_{12} u'_{13} u'_{14} u'_{15} u'_{16}}_{\text{Parity bits}} \right) \quad \text{eq. (21)}$$

$$v' = \left( \underbrace{v'_1 v'_2 v'_3 v'_4 v'_5 v'_6 v'_7 v'_8}_{\text{information bits}} \underbrace{v'_9 v'_{10} v'_{11} v'_{12} v'_{13} v'_{14} v'_{15} v'_{16}}_{\text{Parity bits}} \right) \quad \text{eq. (22)}$$

By controlling the degree of a sub parity check matrix of a layer in a layered LDPC code, the bit error performance may be efficiently adjusted. In the example implementation, when performing lifting such as that illustrated in FIG. 10(c), the element of "1" is replaced by a permutation of the identity matrix. A desired column degree is used to determine the number of "0" elements that can be replaced by a non-zero sub-matrix.

In addition, the maximum number of element "1" in each row of the replacement sub-matrices is restricted to 1. Similarly, the maximum number of element "1" in each column of the replacement sub-matrices is restricted to 1. It will be appreciated by a person skilled in the art that a good parity check matrix for LDPC codes generates a factor graph with no cycles in it. Thus, the above restrictions can ensure that the lifted parity check matrix is a good parity check matrix.

Figure 11A:
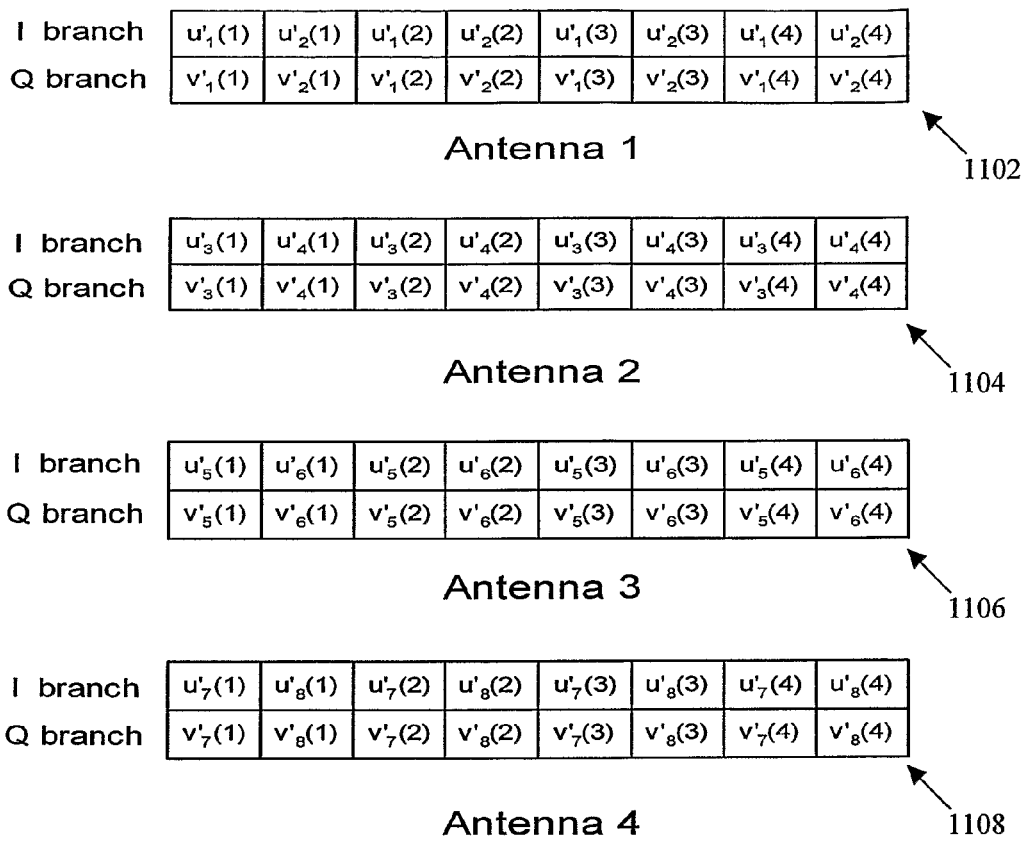
FIGS. 11(a) and (b) are I-branch/Q-branch tables for illustrating signal mapping formats of the lifting LDPC coded data using four transmission antennas.

FIGS. 11(a) and (b) are I-branch/Q-branch tables for illustrating signal mapping formats of the lifting LDPC coded data using $N_T=4$ transmission antennas. Using the layer ST LDPC encoding unit 210 (FIG. 4) and the modulation/symbol mapping unit 212 (FIG. 8), signal mapping formats are provided to map M layers of information bits to $N_T$ transmission streams with QPSK modulation. The signal mapping format illustrated in FIG. 11(a) is associated with the LDPC code illustrated in FIG. 10(a) while the signal mapping format illustrated in FIG. 11(b) is associated with the LDPC codes illustrated in FIG. 10(b) or (c).

Referring to the signal mapping formats illustrated in FIG. 11(a) and FIG. 11(b), information bits and some parity bits of the first layer and information bits of the second layer are mapped to symbols streams to be transmitted by the first and second antennas while the remaining parity bits of the first layer and parity bits of the second layer are mapped to symbol streams to be transmitted by the third and fourth antennas. For FIG. 11(a), compare Tables 1102, 1104, 1106, 1108 with elements of eq. (15) and (16). For FIG. 11(b), compare Tables 1110, 1112, 1114, 1116 with elements of eq. (21) and (22). For description purposes, the notations in FIGS. 11(a) and (b) are given as: $u_i'(k)$ or $v_i'(k)$, where i is the i-th digit in a sub codeword from one layer and k is the index of a sub codeword. Using the illustrated signal mapping formats, coded bits from two layers are distributed in every symbol to achieve higher frequency diversity for OFDM transmission. By comparing the signal mapping formats for four transmission antennas ($N_T=4$) illustrated in FIGS. 11(a) and (b) and the signal mapping formats for two transmission antennas ($N_T=2$) illustrated in FIGS. 9(a) and (b), it can be shown that the signal mapping formats follow the same principle. The principle is to spread signals from each layer to available transmission antennas to achieve spatial diversity and to available sub-carriers in the case of OFDM transmission to achieve frequency diversity.

Figure 12:
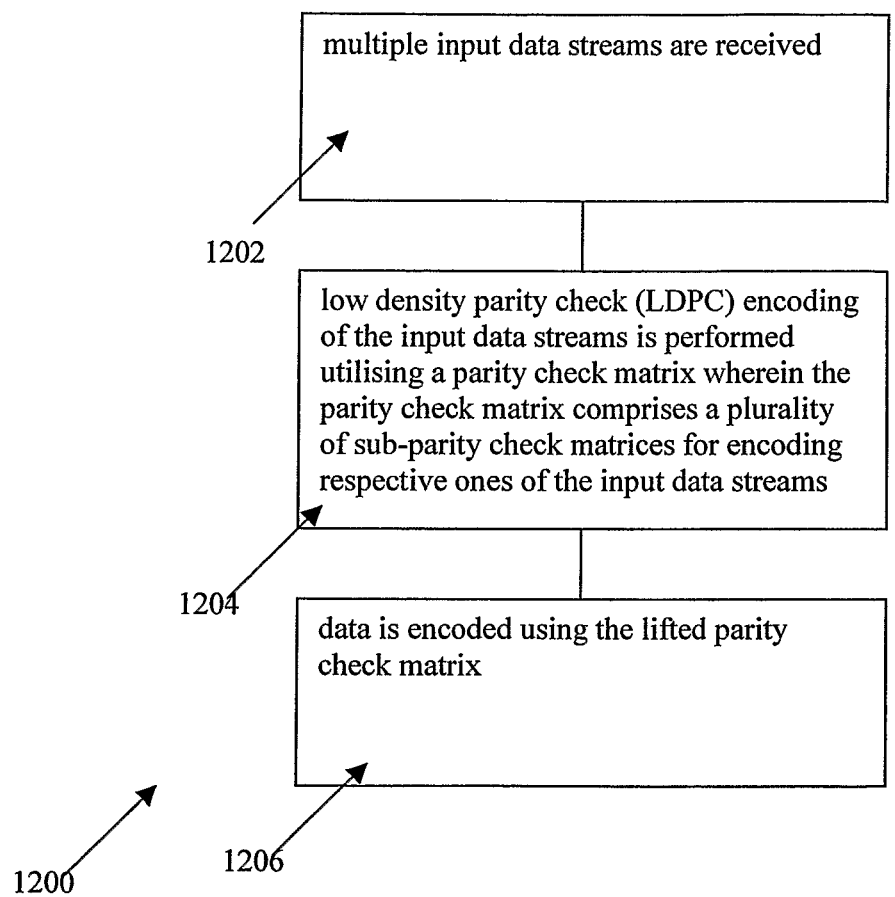
FIG. 12 is a flowchart illustrating a method for data transmission in a multiple input multiple output (MIMO) system.

FIG. 12 is a flowchart 1200 illustrating a method for data transmission in a multiple input multiple output (MIMO) system. At step 1202, multiple input data streams are received. At step 1204, low density parity check (LDPC) encoding of the input data streams is performed utilising a parity check matrix wherein the parity check matrix comprises a plurality of sub-parity check matrices for encoding respective ones of the input data streams. At step 1206, space time encoding is performed for transmitting the LDPC encoded input data streams over a plurality of antennas.

Figure 13:
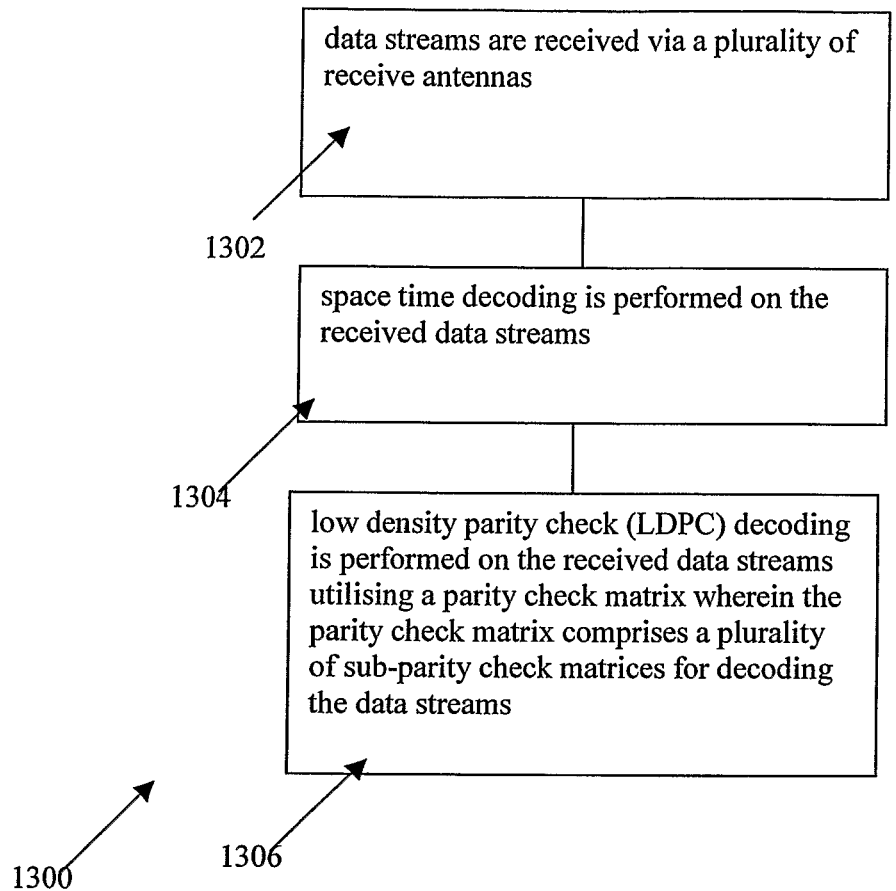
FIG. 13 is a flowchart illustrating a method for processing received data streams in a multiple input multiple output (MIMO) system.

FIG. 13 is a flowchart 1300 illustrating a method for processing received data streams in a multiple input multiple output (MIMO) system. At step 1302, data streams are received via a plurality of receive antennas. At step 1304, space time decoding is performed on the received data streams. At step 1306, low density parity check (LDPC) decoding is performed on the received data streams utilising a parity check matrix wherein the parity check matrix comprises a plurality of sub-parity check matrices for decoding the data streams.

The above example implementation may provide for transmitting and receiving multiple content data (e.g., MBMS services) with different error protections in wireless communication systems. Unequal error protection for simultaneous content data delivery may be provided by employing the lifting layered LDPC coding together with space-time processing, and may be implemented in any wireless MIMO system. The requirements on quality of error protection and data rate may be achieved by using various lifting layered structures of LDPC and various space-time mapping schemes for different priority data.

In the above example implementation, a layered space-time LDPC coding method is used where the parity check matrix is formed by unbalanced lifting from a low density parity check matrix basis and hence may provide transmission adaptation to channel conditions and/or frame length of each layer as well as the number of transmission antennas in a wireless communication system.

The above example implementation may provide a combined system for supporting simultaneously various error protection requirements in high rate data transmission systems (e.g., 3GPP MBMS) at a high system flexibility and low implementation complexity. The arrangement of the transmission rate and protection robustness of the services may be jointly controlled by a Layer LDPC encoder which may assign various code rates, codeword lengths and check degrees to different data with different priorities and a space-time mapper which may provide different space-time processing for different data.

It has been recognised that various channel coding schemes and space-time processing techniques may provide different levels of protection to the distortion of the transmitted data due to the fading and the noise, and may achieve different levels of data transmission rate. By using coding schemes and space-time processing techniques, a more robust transmission may be provided to the higher priority data while a higher transmission rate may be provided to lower priority data. In addition, by using the above example implementation, further protection may be achieved while capacity may be increased at the same time.

Furthermore, different protection for service/data with different priorities may be supported by designing the layered lifting LDPC code and space-time mapping scheme. In the above example implementation, different code rates and/or codeword lengths for different data are controlled by designing a layered LDPC parity check matrix (where a layer corresponds to a priority level) and lifting the layered LDPC parity check matrix according to variations in channel conditions, frame lengths and the number of transmission antennas. In addition, higher diversity in the space, time and frequency domains may be achieved via distributed signal mapping.

In the above example implementation, data with different priority (or different services with different error probability requirements) are processed in accordance with a layered LDPC channel coding scheme and may have different code rates and/or different codeword lengths. The processed data are mapped to a plurality of transmission streams each coupled to an antenna. Different space-time coding may be applied to data from different layers and hence a further protection difference for data from different layers may be realized.

The above example implementation may provide for expanding a layered space-time code and transmitting data through a layered LDPC coding scheme, thereby obtaining superior reliability and flexibility. A lifting LDPC encoder may form a parity check matrix by replacing elements of a layered low density parity check matrix with sub-matrices. The sub-matrices for element replacement may have different dimensions and/or density from layer to layer. A spatial mapper may be concatenated with the lifting LDPC encoder to map encoded data from multiple layers into multiple streams. Each symbol in a data stream may be allocated to a carrier (in the case of OFDM transmission) and transmitted by a transmission antenna.

The above example implementation may provide for expanding a layered space-time code and restoring data through a layered LDPC coding scheme, thereby obtaining superior reliability and flexibility. A lifting LDPC decoder may form a lifting low density parity check matrix by expanding values of elements in a layered low density parity check matrix with a sub-matrix according to channel conditions, frame lengths and an available number of transmission antennas. The received data may be decoded by using the lifting low density check matrix and sub-matrices may be used for expanding elements of the layered low density parity check matrix. The sub-matrices may have different dimensions and/or density from layer to layer.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A method for data transmission in a multiple input multiple output (MIMO) system, the method comprising,
    receiving multiple input data streams;
    performing low density parity check (LDPC) encoding of the input data streams utilizing a parity check matrix, wherein the parity check matrix comprises a plurality of sub-parity check matrices for encoding respective ones of the input data streams; and
    performing space time encoding for transmitting the LDPC encoded input data streams over a plurality of antennas,
    wherein the step of performing the LDPC encoding comprises unbalanced lifting of the parity check matrix prior to encoding the input data streams utilizing the parity check matrix.

2. The method as claimed in claim 1, wherein the unbalanced lifting of the parity check matrix comprises replacing elements of the sub-parity check matrices based on a replacement mapping pattern.

3. The method as claimed in claim 2, wherein the elements are replaced by a sub-matrix.

4. The method as claimed in claim 2, wherein the elements are replaced based on a value of the elements and a location of the elements in the sub-parity check matrices.

5. The method as claimed in claim 1, wherein the unbalanced lifting comprises controlling a row degree, a column degree or both of each of the sub-parity check matrix.

6. The method as claimed in claim 1, wherein the multiple input data streams comprise M input streams of M different classes, and the parity check matrix has M layers, each layer of the parity check matrix corresponding to one of the M classes.

7. The method as claimed in claim 6, wherein the parity check matrix further comprises a plurality of connection matrices, each connection matrix linking two of the M layers such that correlation information between the two layers is included during the LDPC encoding.

8. The method as claimed in claim 7, wherein the parity check matrix is a block-wise low triangular matrix, with the sub-parity check matrices located as blocks along a main diagonal of the parity check matrix.

9. The method as claimed in claim 8, wherein the connection matrices are located as blocks below the main diagonal of the parity check matrix, with blocks above the main diagonal being zero matrices.

10. The method as claimed in claim 6, wherein each class is determined based on one or more of a group consisting of bit error rates, data transmission rates, quality of service (QoS) requirements, number of transmission antennas and transmission conditions.

11. A transmitter in a multiple input multiple output (MIMO) system, the transmitter comprising,
    one or more input units for receiving multiple input data streams;
    a low density parity check (LDPC) encoder; and
    a spatial mapping unit;
    wherein the LDPC encoder performs LDPC encoding of the input data streams utilizing a parity check matrix and the parity check matrix comprises a plurality of sub-parity check matrices for encoding respective ones of the input data streams and the spatial mapping unit performs space time encoding for transmitting the LDPC encoded input data streams over a plurality of antennas, and
    wherein the LDPC encoder performs unbalanced lifting of the parity check matrix prior to encoding the input data streams utilizing the parity check matrix.

12. The transmitter as claimed in claim 11, wherein the unbalanced lifting of the parity check matrix comprises replacing elements of the sub-parity check matrices based on a replacement mapping pattern.

13. The transmitter as claimed in claim 12, wherein the LDPC encoder replaces the elements with a sub-matrix.

14. The transmitter as claimed in claim 12, wherein the LDPC encoder replaces the elements based on a value of the elements and a location of the elements in the sub-parity check matrices.

15. The transmitter as claimed in claim 11, wherein the unbalanced lifting comprises controlling a row degree, a column degree or both of each of the sub-parity check matrix.

16. The transmitter as claimed in claim 11, wherein the multiple input data streams comprises M input streams of M different classes, and the parity check matrix has M layers, each layer of the parity check matrix corresponding to one of the M classes.

17. The transmitter as claimed in claim 16, wherein the parity check matrix further comprises a plurality of connection matrices, each connection matrix linking two of the M layers such that correlation information between the two layers is included during the LDPC encoding.

18. The transmitter as claimed in claim 17, wherein the parity check matrix is a block-wise low triangular matrix, with the sub-parity check matrices located as blocks along a main diagonal of the parity check matrix.

19. The transmitter as claimed in claim 18, wherein the connection matrices are located as blocks below the main diagonal of the parity check matrix, with blocks above the main diagonal being zero matrices.

20. The transmitter as claimed in claim 16, wherein each class is determined based on one or more of a group consisting of bit error rates, data transmission rates, quality of service (QoS) requirements, number of transmission antennas and transmission conditions.

21. A non-transitory computer readable data storage medium having stored thereon computer code means for instructing a multiple input multiple output (MIMO) system to execute a method for data transmission in the MIMO system, the method comprising:
receiving multiple input data streams;
performing low density parity check (LDPC) encoding of the input data streams utilizing a parity check matrix, wherein the parity check matrix comprises a plurality of sub-parity check matrices for encoding respective ones of the input data streams; and
performing space time encoding for transmitting the LDPC encoded input data streams over a plurality of antennas,
wherein the step of performing the LDPC encoding comprises unbalanced lifting of the parity check matrix prior to encoding the input data streams utilizing the parity check matrix.

22. A method for processing received data streams in a multiple input multiple output (MIMO) system, the method comprising,
receiving data streams via a plurality of receive antennas;
performing space time decoding on the received data streams; and
performing low density parity check (LDPC) decoding of the received data streams utilizing a parity check matrix, wherein the parity check matrix comprises a plurality of sub-parity check matrices for decoding the data streams,
wherein the step of performing the LDPC decoding comprises unbalanced lifting of the parity check matrix prior to decoding the received data streams utilizing the parity check matrix.

23. The method as claimed in claim 22, further comprising using a sum-product method for decoding the received data streams.

24. A receiver in a multiple input multiple output (MIMO) system, the receiver comprising,
a plurality of receive antennas for receiving data streams;
a spatial mapping decoder for performing space time decoding on the received data streams; and
a low density parity check (LDPC) decoder for decoding the received data streams utilizing a parity check matrix,
wherein the parity check matrix comprises a plurality of sub-parity check matrices for decoding the data streams, and
wherein the LDPC decoder performs unbalanced lifting of the parity check matrix prior to decoding the received data streams utilizing the parity check matrix.

25. The receiver as claimed in claim 24, wherein the LDPC decoder comprises one or more sum-product decoders.

26. A non-transitory computer readable data storage medium having stored thereon computer code means for instructing a multiple input multiple output (MIMO) system to execute a method for processing received data streams in the MIMO system, the method comprising:
receiving data streams via a plurality of receive antennas;
performing space time decoding on the received data streams; and
performing low density parity check (LDPC) decoding of the received data streams utilizing a parity check matrix, wherein the parity check matrix comprises a plurality of sub-parity check matrices for decoding the data streams,
wherein the step of performing the LDPC decoding comprises unbalanced lifting of the parity check matrix prior to decoding the received data streams utilizing the parity check matrix.

* * * * *